United States Patent [19]

Minami et al.

[11] Patent Number: 4,529,964
[45] Date of Patent: Jul. 16, 1985

[54] ENCODER FOR LENGTH OR ANGLE MEASURING DEVICE WITH HIGH ACCURACY

[75] Inventors: Masana Minami, Kawasaki; Kazuaki Kimura, Tokyo; Masayuki Kondo, Tokyo; Tsuneo Sasaki, Tokyo, all of Japan

[73] Assignees: Tokyo Shibaura Denki Kabushiki Kaisha, Kawasaki; Tokyo Kogaku Kikai Kabushiki Kaisha, Tokyo, both of Japan

[21] Appl. No.: 626,608

[22] Filed: Jul. 6, 1984

Related U.S. Application Data

[63] Continuation of Ser. No. 351,519, Feb. 23, 1982, abandoned, which is a continuation of Ser. No. 84,159, Oct. 12, 1979, abandoned.

[30] Foreign Application Priority Data

Dec. 19, 1978 [JP] Japan .................................. 53-155814
Dec. 19, 1978 [JP] Japan .................................. 53-155815

[51] Int. Cl.³ .............................................. G08C 9/00
[52] U.S. Cl. .......................... 340/347 P; 250/231 SE; 250/237 G; 340/347 M; 33/125 A
[58] Field of Search ................. 340/347 P, 347 M; 250/231 SE, 237 G; 33/125 R, 125 A

[56] References Cited

U.S. PATENT DOCUMENTS

| 2,817,824 | 12/1957 | Albright | 235/443 |
|---|---|---|---|
| 2,993,200 | 7/1961 | Walker et al. | 250/231 SE X |
| 2,995,705 | 8/1961 | Walker et al. | 250/231 SE X |
| 3,096,444 | 7/1963 | Seward | 340/347 P X |
| 3,309,525 | 3/1967 | Johnson | 250/231 SE |
| 3,364,359 | 1/1968 | Cronin | 250/231 SE |
| 3,599,004 | 8/1971 | Grendelmeier | 250/237 G |
| 3,891,143 | 6/1975 | Haeusler | 340/347 AD X |
| 3,946,422 | 3/1976 | Yagi et al. | 365/146 X |
| 3,985,448 | 10/1976 | Wiklund et al. | 356/169 |
| 4,074,258 | 2/1978 | Dore et al. | 340/347 P |
| 4,100,420 | 7/1978 | Metcalf et al. | 250/231 SE X |

FOREIGN PATENT DOCUMENTS 53-64055 6/1978 Japan .

OTHER PUBLICATIONS

Sayce, Gratings in Metrology, Journal of Physics E: Scientific Instruments, V. 5, No. 2, 1972, pp. 193-198.

Primary Examiner—T. J. Sloyan
Attorney, Agent, or Firm—Oblon, Fisher, Spivak, McClelland & Maier

[57] ABSTRACT

An encoder for measuring devices having a code plate including binary grating patterns arranged in a given regular fashion and forming a first scale, a linear sensor including photodiode elements arranged with fixed intervals and forming a second scale disposed in parallel with the code plate, and processor means for absolute-interpolating one pitch of the first or second scale on the basis of reading data or information obtained from the linear sensor corresponding to a relative position of the patterns to the elements.

When the number of the scale divisions of the first scale within a fixed range is N, the number of the scale divisions of the second scale is N+1. Accordingly, when the first scale is a main scale, the second scale is a vernier scale. The processor means detects a phase inverting point corresponding to the interpolation point on the basis of the reading data. The processor means performs the absolute interpolation by detecting the phase inverting point.

19 Claims, 128 Drawing Figures

F I G. 3A
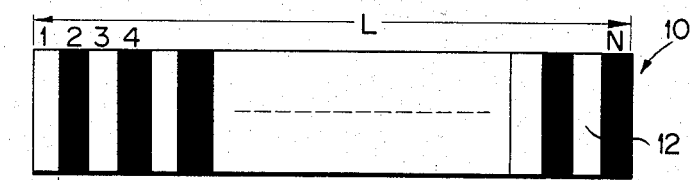
F I G. 3B
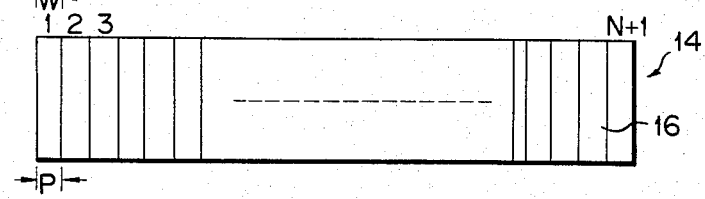
F I G. 4A
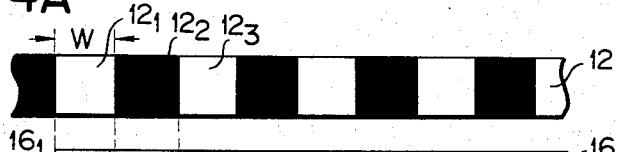
F I G. 4B  S=0
F I G. 4C 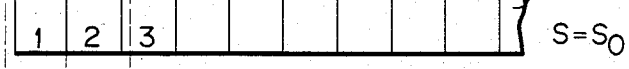 $S=S_0$
F I G. 4D  $S=2S_0$
F I G. 4E 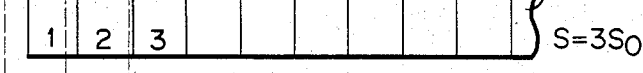 $S=3S_0$
F I G. 4F 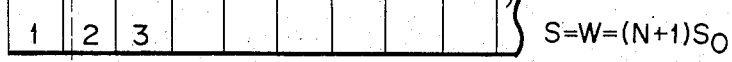 $S=W=(N+1)S_0$
F I G. 4G  $S=2W$

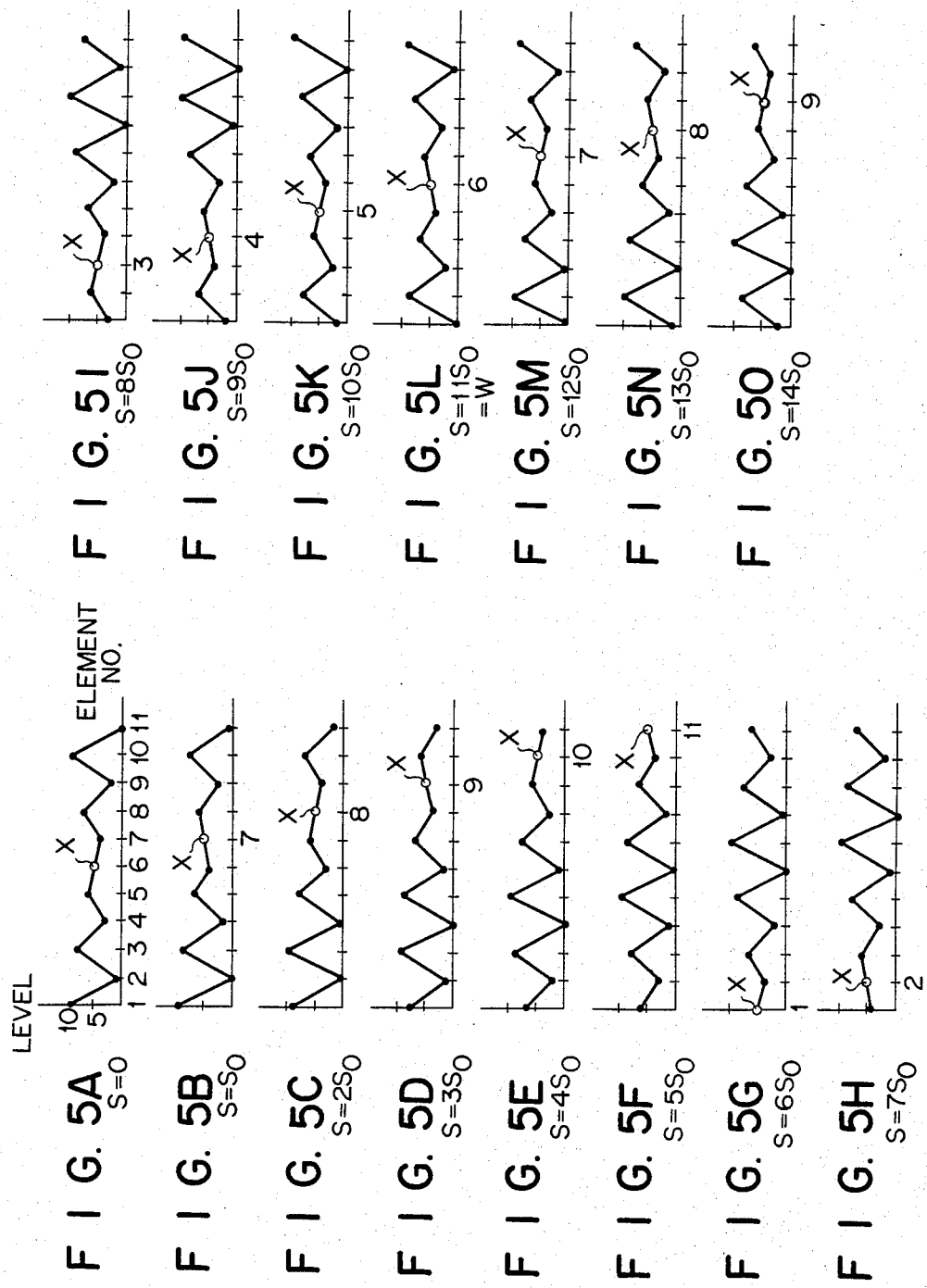

FIG. 5P  S=15S₀ 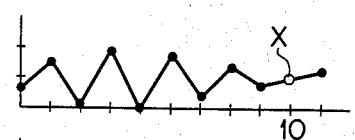
FIG. 5Q  S=16S₀ 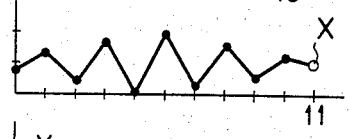
FIG. 5R  S=17S₀ 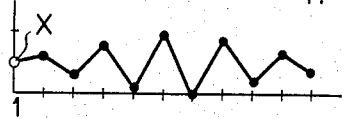
FIG. 5S  S=18S₀ 
FIG. 5T  S=19S₀ 
FIG. 5U  S=20S₀ 
FIG. 5V  S=21S₀ 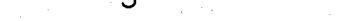
FIG. 6A
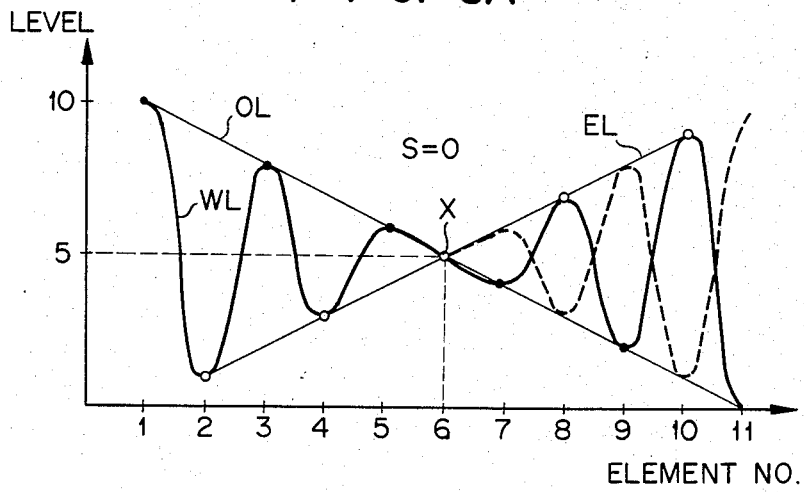

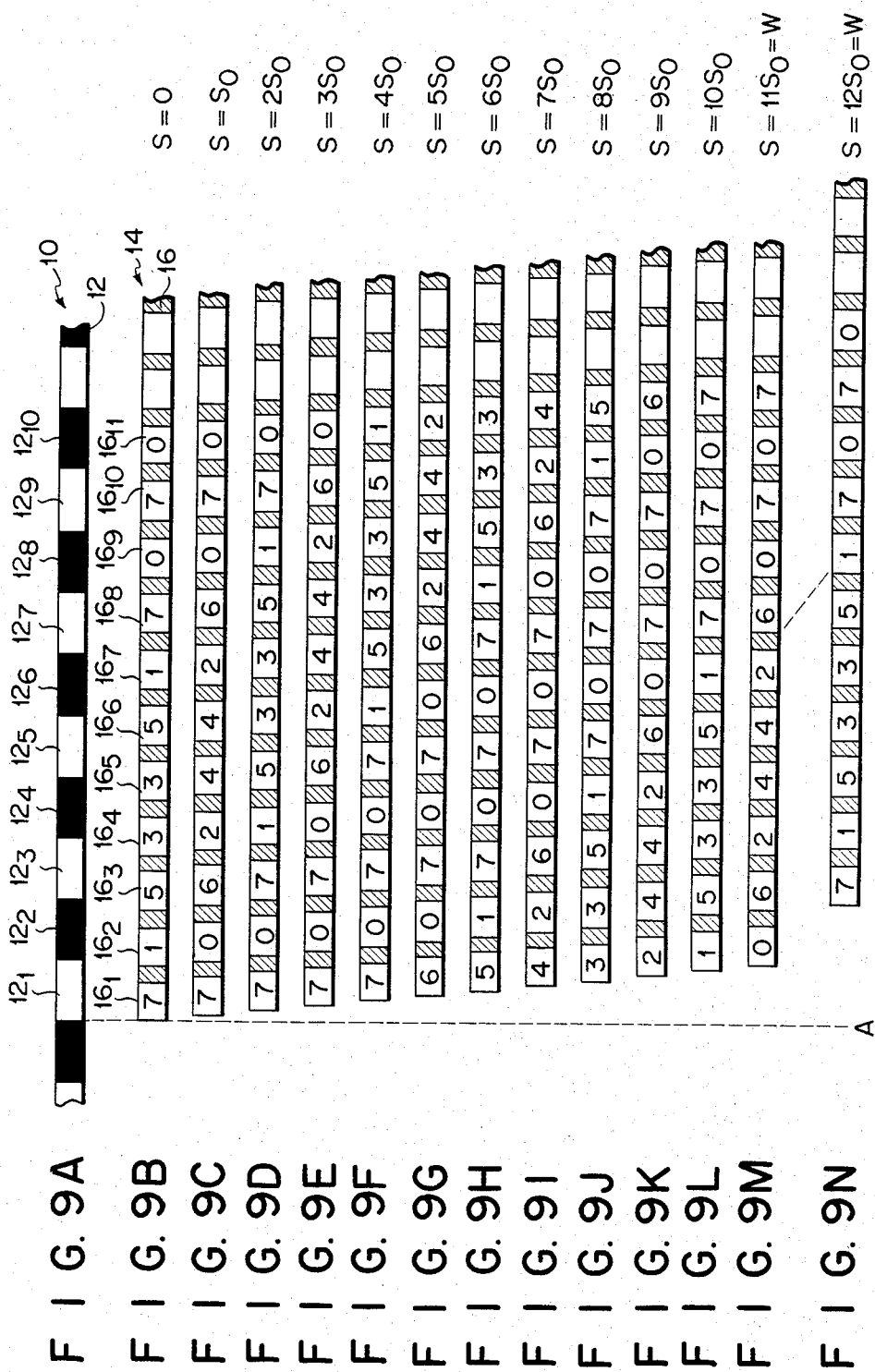

$S=0$ $S=11S_0$ $S=S_0$ $S=12S_0$ $S=2S_0$ $S=13S_0$ $S=0$
ELEMENT NO.

$S=5S_0$ $S=S_0$ $S=6S_0$ $S=2S_0$ $S=7S_0$ $S=3S_0$ $S=8S_0$ $S=4S_0$ $S=9S_0$

FIG. 12A  S=0 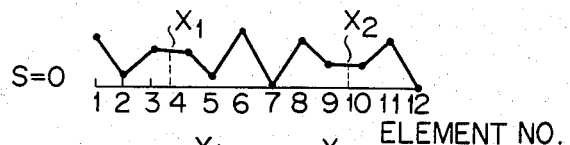
FIG. 12B  S=S₀ 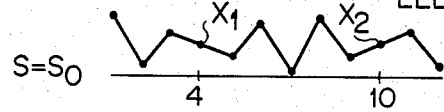
FIG. 12C  S=2S₀ 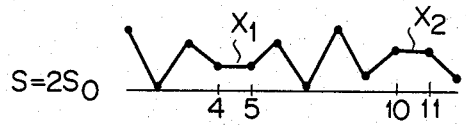
FIG. 12D  S=3S₀ 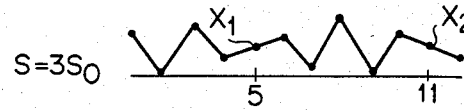
FIG. 12E  S=4S₀ 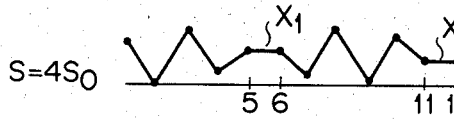
FIG. 12F  S=5S₀ 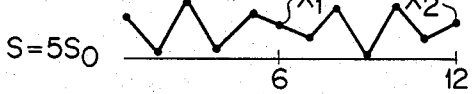
FIG. 12G  S=6S₀ 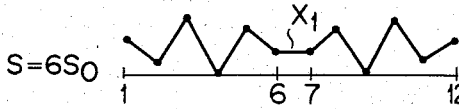
FIG. 12H  S=7S₀ 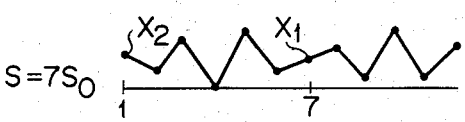
FIG. 12I  S=8S₀ 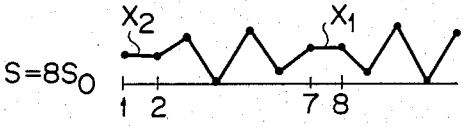
FIG. 12J  S=9S₀ 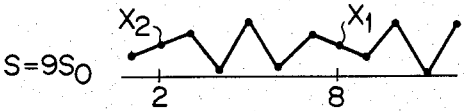
FIG. 12K  S=10S₀ 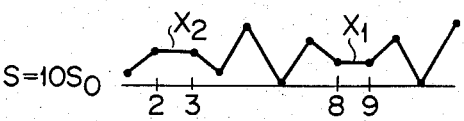
FIG. 12L  S=11S₀ 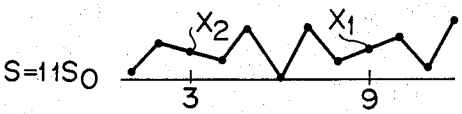

FIG. 14
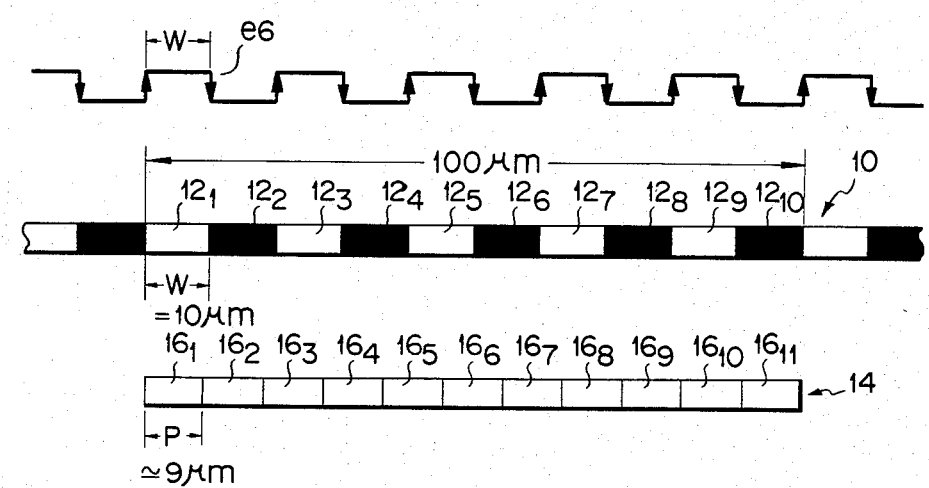
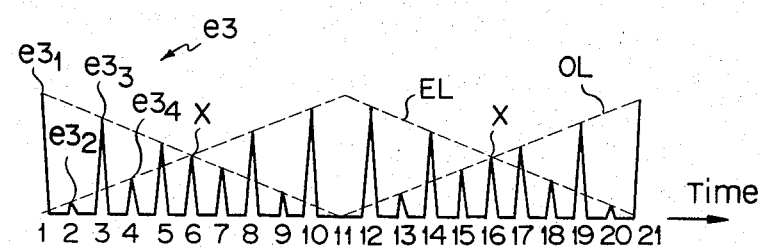
FIG. 15A
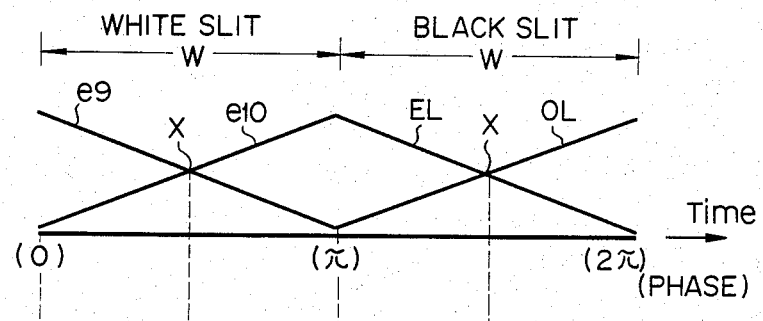
FIG. 15B
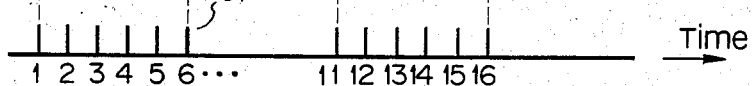
FIG. 15C
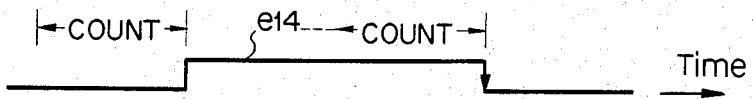
FIG. 15D F I G. 15G
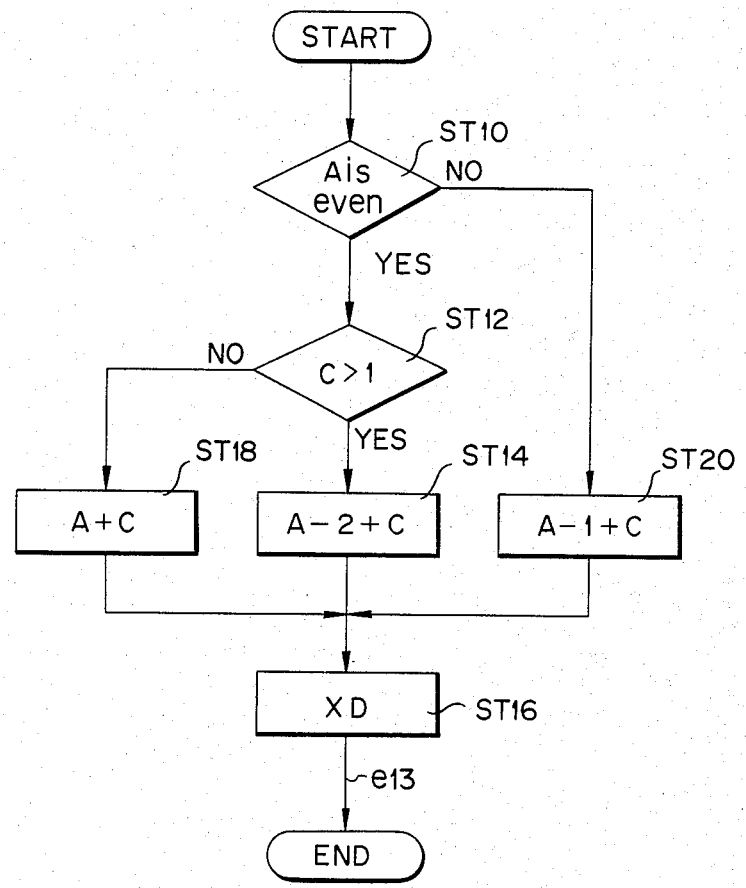

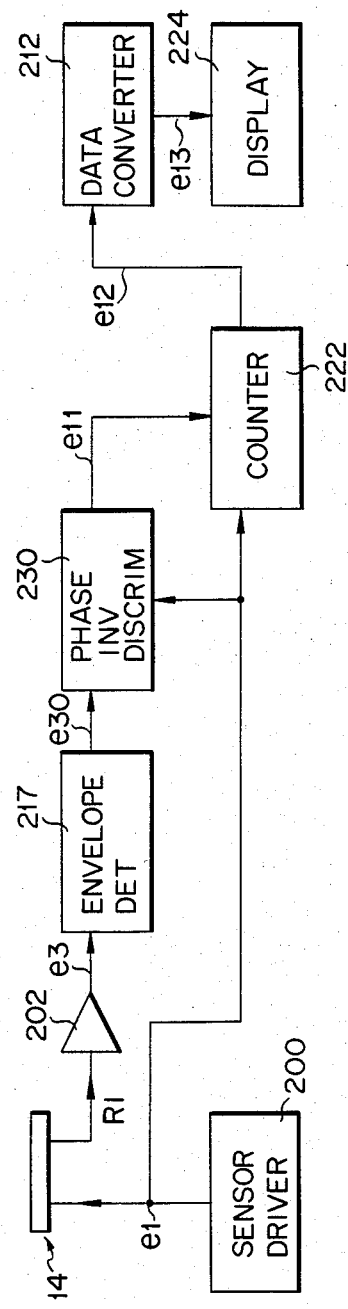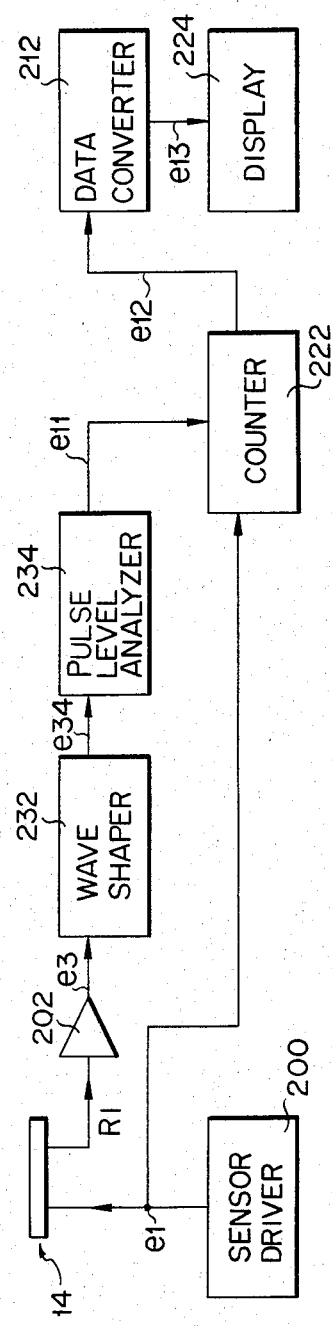

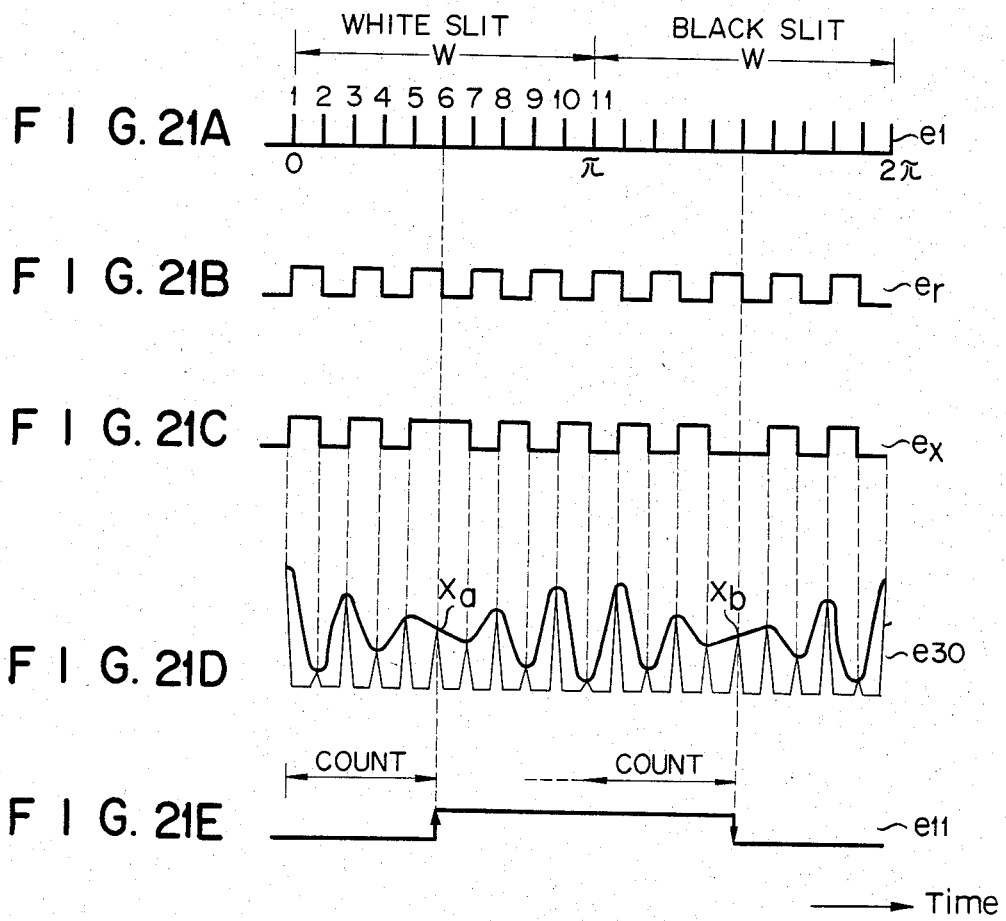
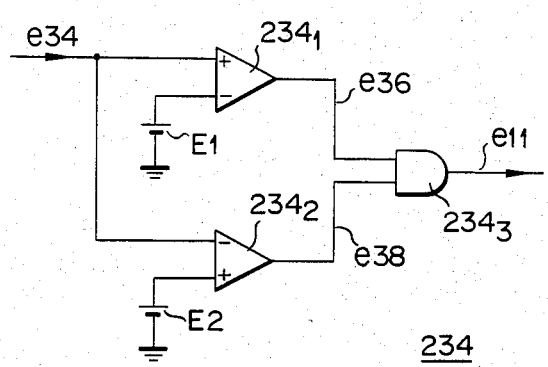

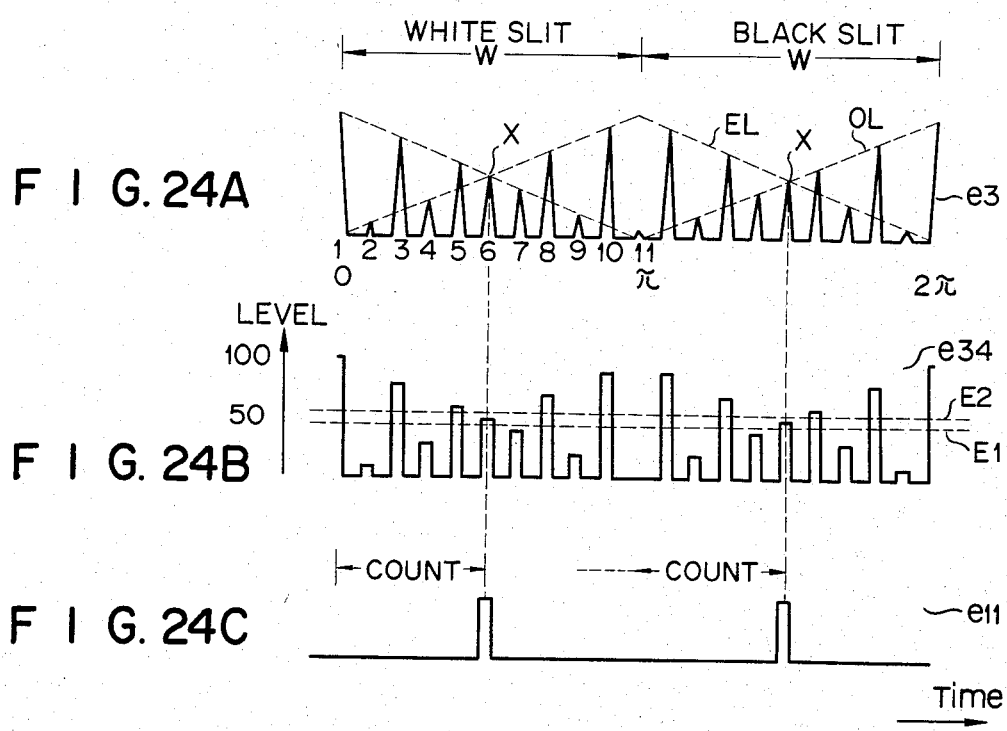
FIG. 24A
FIG. 24B
FIG. 24C
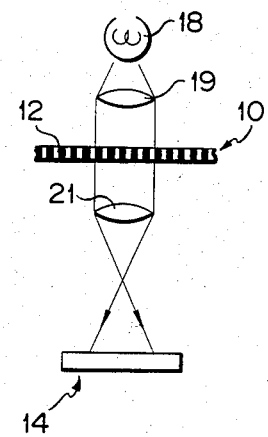
FIG. 25
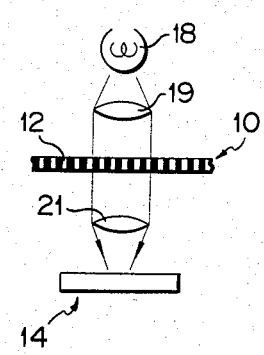
FIG. 26

F I G. 29
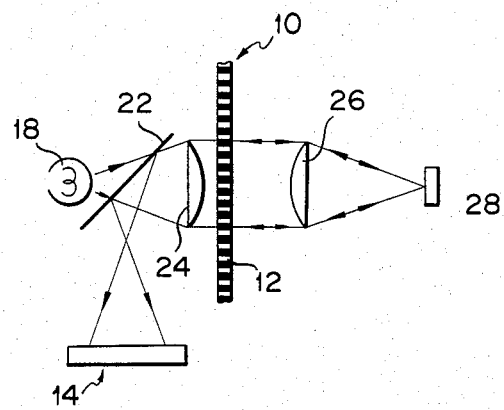
F I G. 30
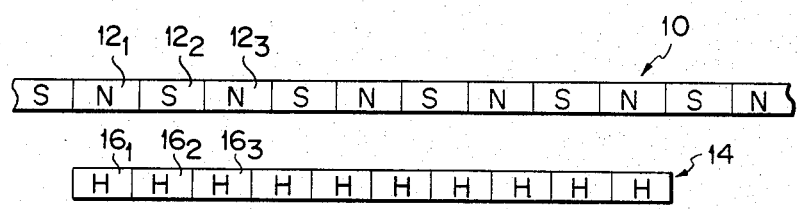

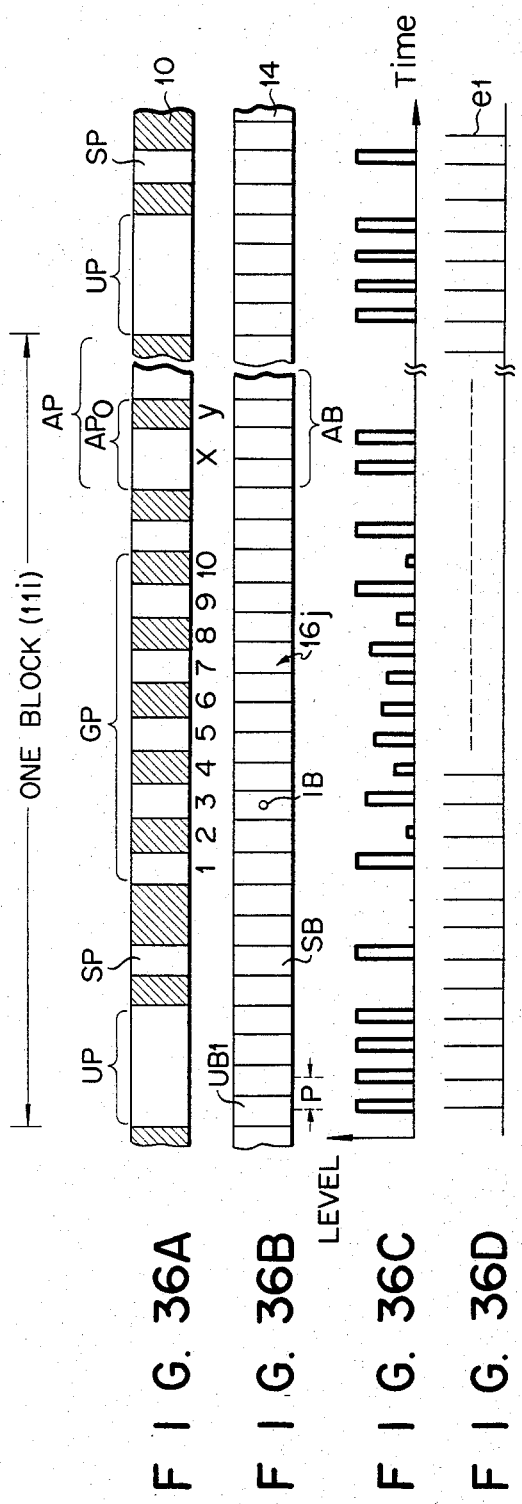

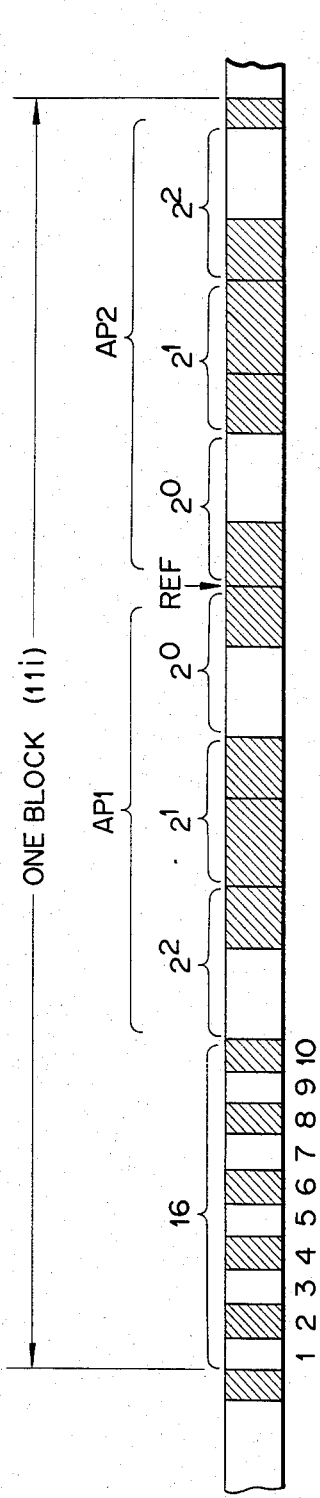
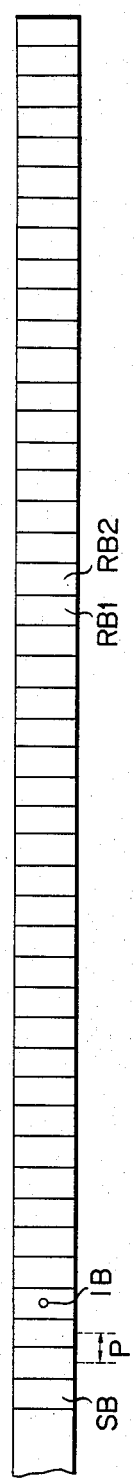
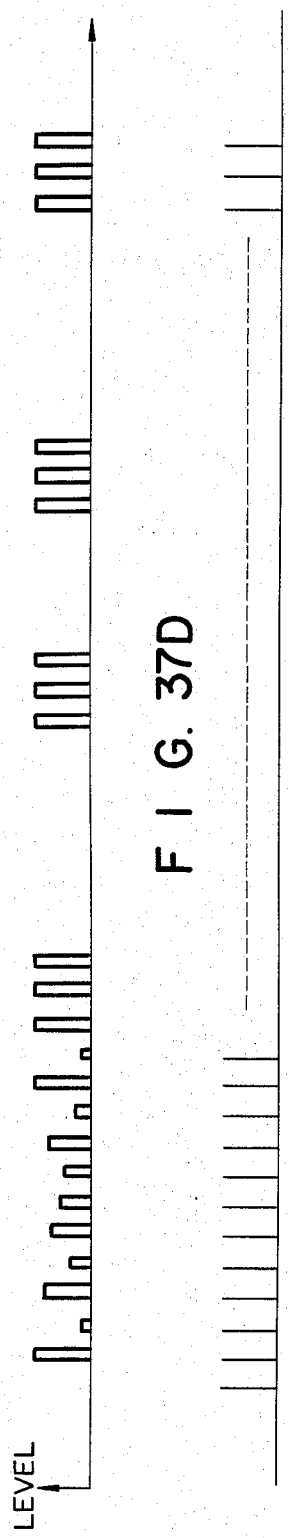
FIG. 37A
FIG. 37B
FIG. 37C
FIG. 37D

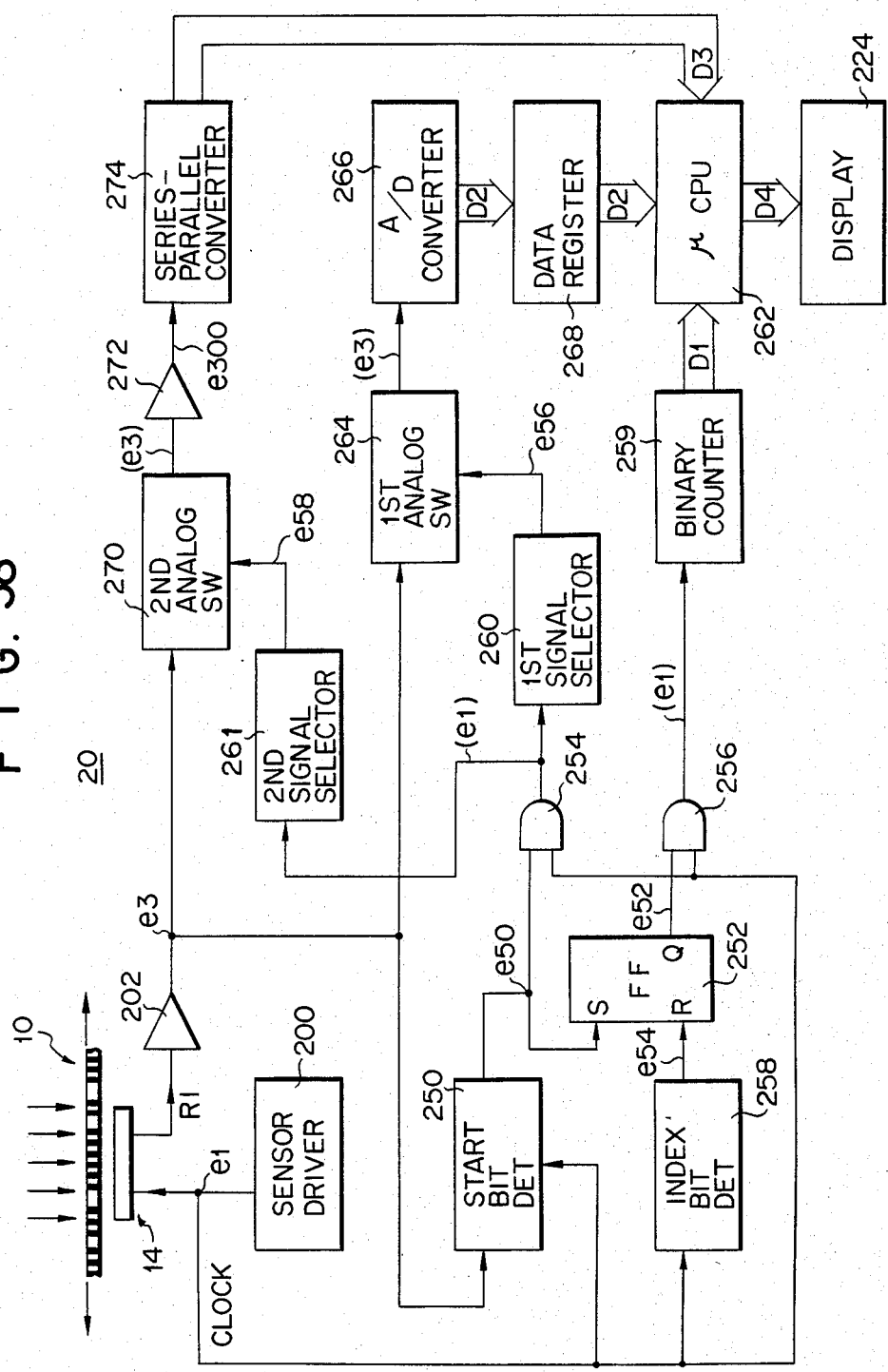
F I G. 38

F I G. 39
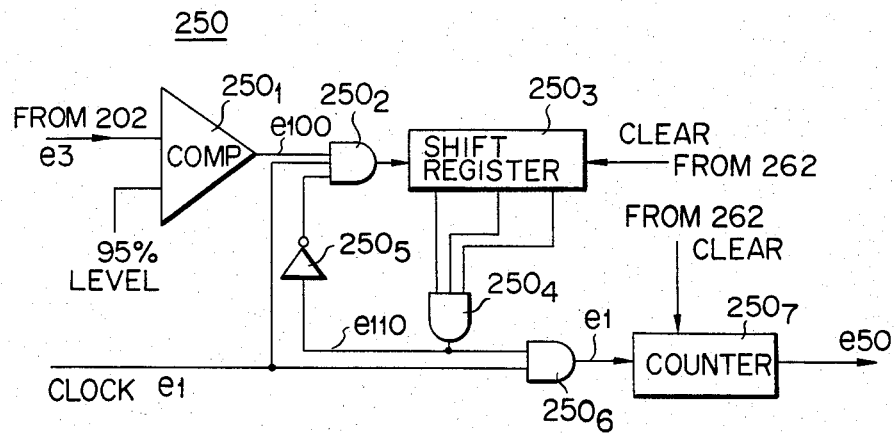
F I G. 40
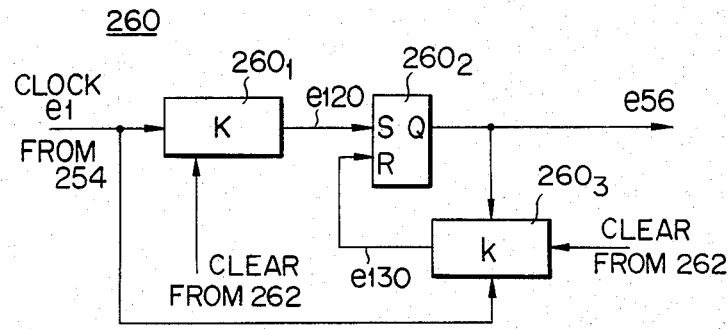

ENCODER FOR LENGTH OR ANGLE MEASURING DEVICE WITH HIGH ACCURACY

This application is a continuation of application Ser. No. 351,519, filed Feb. 23, 1982, abandoned, which is a continuation of application Ser. No. 084,159, filed Oct. 12, 1979, abandoned.

BACKGROUND OF THE INVENTION

1. Field of the Invention

The invention relates to an encoder for measuring devices to digitally measure a length or an angle with high accuracy and high resolution.

2. Description of the Prior Art

Generally, a linear encoder or a rotary encoder has been known as an encoder in use for a measuring device for digitally measuring a length or an angle. The linear encoder is used for the measurement of a length while the rotary encoder for the measurement of an angle. Those encoders are essentially the same, except that the former has a linear code pattern and the latter a circular code pattern. Those encoders are categorized into an optical encoder and an electromagnetic encoder using magnetic or electrostatic induction.

In manufacturing those encoders, there is a limit in the graduations of the scale plate and therefore the improvement of the measuring accuracy is restricted. This restriction is inevitable irrespective of whether the scale is read out optically or magnetically. The minimum measuring limit, i.e. the minimum scale value, entirely depends on the limit attendent on the fractionalization of the scale. To obtain a more precise measurement or improve a resolution of the measurement (to measure smaller scale values than the minimum scale value), it is necessary to interpolate the scale division. To this end, various measuring methods using the interpolation have been proposed.

In a conventional encoder adapted for the measuring device using the interpolation method, a couple of sensors are provided to read out the information of optical or magnetic gratings corresponding to a scale on an encoding plate a code plate. Those sensors read out a couple of information differing in phase by 90°, i.e. ¼ pitch of the scale on the code plate. By processing those two pieces of information, the interpolation of the scale division of the grating pattern is made. The following three interpolations are known. The first interpolation consists in that a couple of sine wave signals with different phases are wave-shaped into rectangular wave signals with references of the cross points where the two sine wave signals cross zero potential. By counting the leading and trailing edges of the two pulse trains of rectangular pulses, one period (one pitch) is interpolated. The second interpolation consists in that a couple of output signals with 90°—different phases produced from an encoder are used. In this interpolation, the amplitude ratio therebetween is employed for the interpolation of one period. The third interpolation consists in that two signals with 90°—different phases are modulated by a carrier with a given frequency. The interpolation of one period is made by detecting a phase difference between the non-modulated composed signal and the carrier signal. The improvement of the resolution obtained by those interpolations is at most ¼ pitch.

The interpolations described above, however, require an analog signal processing circuit. An extremely complicated and costly circuit therefore is needed for analog processing, with insufficient accuracy. On the contrary, if the omission of such processing circuit is required, the pattern pitch of the coading boad should be formed minutely. In this case, however, the production of the coading boad is difficult and is very expensive.

SUMMARY OF THE INVENTION

Accordingly, an object of the invention is to provide an improved encoder for a measuring device in which the interpolation of the minimum scale value on a code plate with a simple scale pattern is performed in the absolute interpolation method.

In order to achieve the above object, there is provided an encoder comprising: first scale means having a plurality of binary patterns arranged in a given regular fashion and forming a first scale for a measurement; second scale means having a plurality of independant sensor elements arranged in opposition to the binary pattern and forming a second scale for the measurement; the first and second scale means are related in a main- and vernier-scale relation; and processor means for interpolating one pitch of the first or second scale on the basis of the read out data obtained from the second scale means corresponding to a relative position of the binary patterns to the sensor elements.

In the encoder thus constructed, the first scale means may use a code plate with a simple, single track on which two kinds of patterns are repeated with given pitches. The second scale means may use a sensor array (linear sensor) where the sensor elements are arranged with given pitches different from those of the binary pattern. If the first scale is a main scale, the second scale is used as a vernier scale. If the 10 pitches of the first scale correspond to 11 pitches of the second scale, the interpolation is possible up to 1/11 of one pitch of the first scale. In this case, the interpolation point is determined by electrically processing read-out data applied from the sensor array to the processor means. In other words, a distribution of data applied from the code plate to the sensor elements of the sensor array, changes in accordance with the position of the interpolation point. The distribution may be determined depending on only the relative position of the code plate to the sensor array. Therefore, the absolute interpolation is performed by electrically detecting the data distribution.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A and 3B show enlarged views of binary grating patterns 12 and photosensor elements 16 shown in FIG. 1;

FIGS. 4A to 4G show relative movements or displacements of the patterns 12 to the elements 16 shown in FIGS. 3A and 3B;

FIGS. 5A to 5V show graphs for illustrating distributions of photoelectric converted outputs outputted from the elements when the relative displacements of the patterns 12 to the elements 16 are changed as shown in FIGS. 4A to 4G, and graphically illustrate the contents in Table 1 for each displacement in which p=NW/(N+1);

FIGS. 6A, 6B, 6L and 6M show the graphs of FIGS. 5A, 5B, 5L and 5M expressed in another graphical form, in which FIG. 6A shows an oscillating state of the levels of the output signals produced from the elements 16, and odd-number envelope lines OL and even-number envelope lines EL are illustrated;

FIGS. 9A to 9N illustrate relative displacements of the patterns 12 to the elements 16 when the elements 16 having the optical insensitive zones l as shown in FIG. 8B are used;

FIGS. 12A to 12L show graphs for illustrating level distributions of the output signals produced from the elements 16 when the displacements S are 0, So, 2So, .. 11So, in which P=NW/(N+2);

FIG. 14 diagramatically illustrates the sizes and patterns of the code plate 10 and the linear sensor 14 shown in FIG. 13;

FIGS. 15A to 15D show wave forms useful in explaining the interpolation reading shown in FIG. 13;

FIG. 15G shows the program flow of measuring in the case where the coarse and vernier reading data as shown in FIGS. 15E and 15F are used.

FIG. 19 shows a block diagram of a modification of the construction for making the vernier reading or the interpolation reading in the circuitry shown in FIG. 13;

FIGS. 21A to 21E show a set of wave forms useful in explaining the operation of the construction shown in FIG. 19;

FIG. 22 shows a block diagram of another modification of the construction for making the vernier reading or the interpolation reading in the encoder shown in FIG. 13;

FIG. 23 shows a circuit diagram of a pulse level analyer 234 shown in FIG. 22;

FIGS. 24A to 24C show wave forms for illustrating the operation of the construction shown in FIG. 22;

FIGS. 25 to 29 show modifications of the optical systems applied for the code plate 10 and the linear sensor 14 shown in FIGS. 1, 2 or 13;

FIG. 30 shows an example using the combination of a magnetic film 10 and a semiconductor Hall elements array 14 in place of the combination of the code plate and the linear sensor;

FIGS. 36A to 36D diagramatically illustrate how the patterns in one block are read out when the pattern arrangement shown in FIG. 33 is used;

FIGS. 37A to 37D diagramatically illustrate how the patterns in one block $11_l$ is read out when the pattern arrangement shown in FIG. 34 is used;

FIG. 38 shows a block diagram of another modification of the encoder shown in FIG. 13 in which the coarse reading and the vernier reading or the interpolation reading are performed in the absolute method;

FIG. 39 shows a circuit diagram of a start bit detector 250 shown in FIG. 38; and FIG. 40 shows a circuit diagram of a signal selector 260 shown in FIG. 38.

DESCRIPTION OF THE PREFERRED EMBODIMENTS

Figure 1:
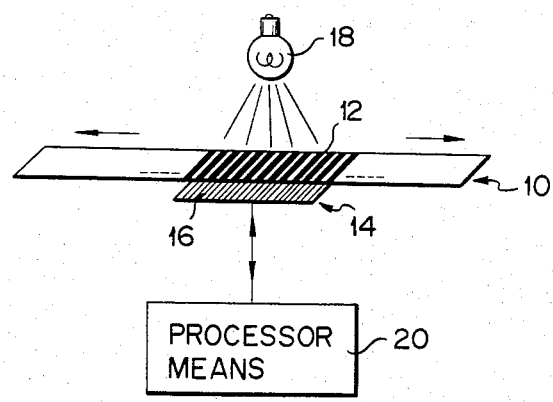
FIG. 1 shows a schematic representation used when an encoder according to the invention is applied to a measuring device for measuring a length.

Before proceeding with preferred embodiments of the invention, it should be understood that like reference numerals are used to designate like or equivalent portions or parts throughout the drawings, for simplicity of explanation. Therefore, the portions or parts designated by like reference numerals may be interchanged to each other throughout the drawings.

GENERAL

Reference is first made to FIG. 1 illustrating in schematic form an arrangement used when an encoder according to the invention is applied to a device to measure a length. A number of binary coading patterns 12 are marked with given pitches on a code plate 10 horizontally moved with an object to be measured (not shown). The patterns 12 are transparent patterns (white) and non-transparent patterns (black) regularly arranged on the code plate 10 in a direction of the plate movement. Those patterns are comprised of slits. The white pattern with its transmittance "1" and the black pattern with its transmittance "0" are both called slits. The patterns 12 form a first scale for measuring a length. Right under the code plate 10, a sensor array or a linear sensor 14 is parallelly arranged in opposition to the patterns 12. The linear sensor 14 has a number of sensor elements or photosensor elements 16 arranged with pitches different from those of the patterns 12. These photosensor elements 16 independently perform an optoelectric conversion. The photosensor elements 16 from a second scale corresponding to the first scale. The first scale corresponds to a main scale and the second scale to a vernier scale. The pitches of the patterns 12 projected onto the 11-pitch width of the elements 16 are selected to be 10 pitches, for example.

The relationship between the main scale and the vernier scale, i.e. the code plate 10 and the linear sensor 14, is optically set up. The linear sensor 14 is illuminated by a lamp 18, through the transparent patterns. Since the pitch of the pattern 12 is different from that of the element 16, an amount of light incident upon the elements 16 through the pattern 12 is different for each element 16. In other words, optoelectric converting outputs or read-out data produced from the respective elements 16 are different depending on a relative static position between the code plate 10 and the linear sensor 14. The read-out data is applied to a processor means 20. Then, the means 20 absolute-interpolates a length smaller than one pitch of the pattern 12 on the basis of the read-out data. The absolute interpolation will subsequently be discused.

Figure 2:
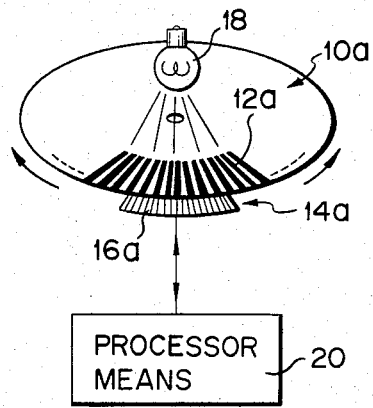
FIG. 2 shows a schematic representation used when an encoder according to the invention is applied to a measuring device for measuring an angle.

FIG. 2 shows a schematic representation of an arrangement when the encoding arrangement shown in FIG. 1 is applied to a device for measuring an angle. As shown, a code disc 10a horizontally rotating with an object to be measured (not shown) has binary grating patterns 12a arranged with given angular intervals. The binary patterns 12a forms a first scale for measuring an angle. Right under the code disc 10a, linear sensors 14a are parallelly disposed in opposition to the pattern 12a. The linear sensor 14a has a number of photosensor elements 16a arranged with angular intervals different from those of the pattern 12a. The elements 16a form a second scale corresponding to the first scale. The measuring arrangement performs an absolute interpolation, as in the case of FIG. 1.

PRINCIPLE OF ABSOLUTE INTERPOLATION

Explanation to follow is the principle of the absolute interpolation. The arrangement shown in FIG. 1 will be used for the explanation of the interpolation. FIGS. 3A and 3B show enlarged views of the binary grating patterns 12 and the photosensor elements 16 shown in FIG. 1, respectively. Let us assume that the number of slits within patterns 12 present within a fixed length L is designated by N the width of slits or, the pitch of the pattern 12 is W, and further that the number of the elements 16 present within the fixed length L is designated by N+1 and the pitch of the elements 16 by P. In this case, the following equation holds $$P = NW/(N+1) \qquad (1)$$

FIGS. 4A to 4G diagramatically illustrate relative displacements of the linear sensor 16 to the patterns 12.

Here, a reference line A is set up at the left side of a slit $12_1$ (white pattern) of those patterns 12. A state shown in FIG. 4B has the coincidence of the reference line A with the left side of the first element $16_1$ (the second and subsequent elements 16 are denoted by annexing 2 and subsequent numbers to the numeral 16). The unitary amount So of the relative displacement of the elements 16 to the patterns 12 is defined as below $$So = W/(N+1) \qquad (2)$$

FIGS. 4C, 4D, 4E ... illustrate that displacements S of the elements from the reference line A are So, 2So, 3So ..., respectively. When the displacement S is given by $S = (N+1)$ So = W, the left side of the first element $16_1$ coincides with the right side of the slit $12_1$ or the left side of the slit (black slit) $12_2$. When the displacement S is equal to 2W, i.e. S = 2W, the left side of the first element $16_1$ coincides with the right side of the slit $12_2$ or the left side of the slit (white slit) $12_3$.

With respect to a distribution of the amount of light distributed over the respective elements 16 through the patterns 12, FIG. 4B is the same as FIG. 4G. In more particular, the displacement S of 2W, i.e. S = 2W, corresponds to one period of the repetition cycle of the white and black slits in the patterns 12, and the displacement S of W, i.e., S = W, corresponds to a ½ period of the repetition cycle. Assume again that the number N of the slits of the patterns 12 within the fixed length L is 10 and the number N+1 of the elements 16 within the fixed length L is 11. On the assumption, the optoelectric converted outputs of the respective elements $16_1$ to $16_{11}$ are related to the displacements S as shown in Table 1.

TABLE 1

| N = 10 ELEMENT NO. | DISPLACEMENT S | | | | | | | | | | | | | | | | | | | | | |
|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| $16_1$ | 10 | 10 | 9 | 8 | 7 | 6 | 5 | 4 | 3 | 2 | 1 | 0 | 0 | 1 | 2 | 3 | 4 | 5 | 6 | 7 | 8 | 9 |
| $16_2$ | 1 | 0 | 0 | 1 | 2 | 3 | 4 | 5 | 6 | 7 | 8 | 9 | 10 | 10 | 9 | 8 | 7 | 6 | 5 | 4 | 3 | 2 |
| $16_3$ | 8 | 9 | 10 | 10 | 9 | 8 | 7 | 6 | 5 | 4 | 3 | 2 | 1 | 0 | 0 | 1 | 2 | 3 | 4 | 5 | 6 | 7 |
| $16_4$ | 3 | 2 | 1 | 0 | 0 | 1 | 2 | 3 | 4 | 5 | 6 | 7 | 8 | 9 | 10 | 10 | 9 | 8 | 7 | 6 | 5 | 4 |
| $16_5$ | 6 | 7 | 8 | 9 | 10 | 10 | 9 | 8 | 7 | 6 | 5 | 4 | 3 | 2 | 1 | 0 | 0 | 1 | 2 | 3 | 4 | 5 |
| $16_6$ | 5 | 4 | 3 | 2 | 1 | 0 | 0 | 1 | 2 | 3 | 4 | 5 | 6 | 7 | 8 | 9 | 10 | 10 | 9 | 8 | 7 | 6 |
| $16_7$ | 4 | 5 | 6 | 7 | 8 | 9 | 10 | 10 | 9 | 8 | 7 | 6 | 5 | 4 | 3 | 2 | 1 | 0 | 0 | 1 | 2 | 3 |
| $16_8$ | 7 | 6 | 5 | 4 | 3 | 2 | 1 | 0 | 0 | 1 | 2 | 3 | 4 | 5 | 6 | 7 | 8 | 9 | 10 | 10 | 9 | 8 |
| $16_9$ | 2 | 3 | 4 | 5 | 6 | 7 | 8 | 9 | 10 | 10 | 9 | 8 | 7 | 6 | 5 | 4 | 3 | 2 | 1 | 0 | 0 | 1 |
| $16_{10}$ | 9 | 8 | 7 | 6 | 5 | 4 | 3 | 2 | 1 | 0 | 0 | 1 | 2 | 3 | 4 | 5 | 6 | 7 | 8 | 9 | 10 | 10 |
| $16_{11}$ | 0 | 1 | 2 | 3 | 4 | 5 | 6 | 7 | 8 | 9 | 10 | 10 | 9 | 8 | 7 | 6 | 5 | 4 | 3 | 2 | 1 | 0 |

In Table 1, numerals in the upper row representing displacements S, S = 0, 1, 2 ... respectively correspond to S = 0, So, 2So ... in FIGS. 4B to 4G. For example, S = 11 corresponds to S = W in FIG. 4F and S = 21 corresponds to S = W + NSo (= 2W − So), i.e. the unit displacement preceeding by So to S = 2W in FIG. 4G. Numerals $16_1$, $16_2$, $16_3$ ... in column represent the number of photosensor elements of the linear sensor 14. In Table 1, numeral "10" designates an optoelectric converted output when the element 16 is entirely illuminated through a slit with the transmittance "1" of the patterns 12. Numeral "0" designates an optoelectric converted output when the element 16 is entirely illuminated through a slit with the transmittance of "0". Numerals "1" to "9" denote optoelectric converting outputs each proportional to an area illuminated through a slit with a transmittance "1". The column of each displacement in Table 1 shows a light amount distribution of light illuminated over the elements $16_1$ to $16_{11}$, or a level distribution of read out data RI.

FIGS. 5A to 5V show graphs illustrating peak levels in time sequential manner of the optoelectric converting outputs serially read out from the elements $16_1$ to $16_{11}$. In each graph, the vertical coordinate axis represents an optoelectric converting output level while the horizontal coordinate axis represents the respective elements $16_1$ to $16_{11}$ in terms of the suffixes annexed to the element notation 16. In other words, FIGS. 5A to 5V show output level distributions of the elements $16_1$ to $16_{11}$ for S=0 to 21, respectively. Note here that the output levels "5" in those figures are maked with white circles for distinguishing them from other levels. As seen from the figures, the elements providing the output levels "5" successively change with the change of the displacement S. In more particular, within one pitch W, the displacements S=0, So, 2So, . . . are detected by the elements $16_6$, $16_7$, $16_8$, . . . providing output level "5". In other words, by detecting the elements providing the level "5", the one-pitch width W of the patterns 12 is divided into fractions each of 1/11 or 1/(N+1), that is to say, the interpolation with the minimum unitary value So is performed.

Substituting the equation (2) into the equation (1), we have $$P = NSo \tag{3}$$

As described above, the displacements are detected with So of the unit, and therefore one pitch P of the elements 16 may be divided into fractions each of 1/10 or 1/N. Accordingly, also when the linear sensor 14 is used for the main scale, the interpolation with So for its minimum value is allowed.

Figure 6B:
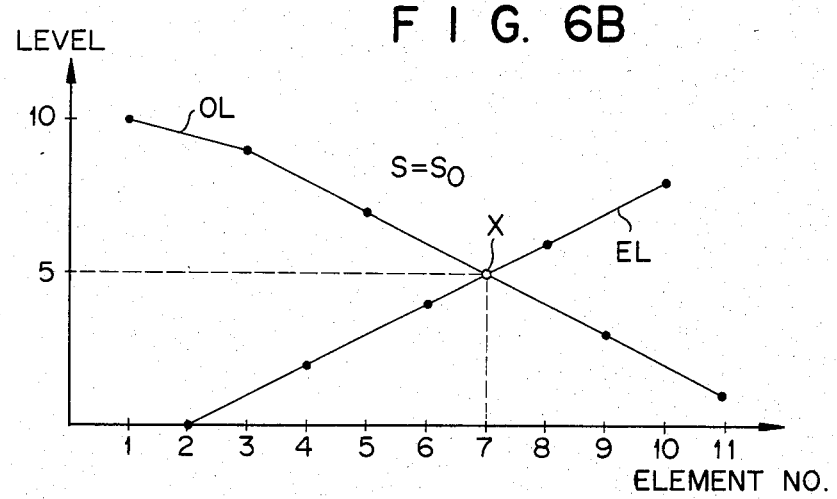
Figure 6L:
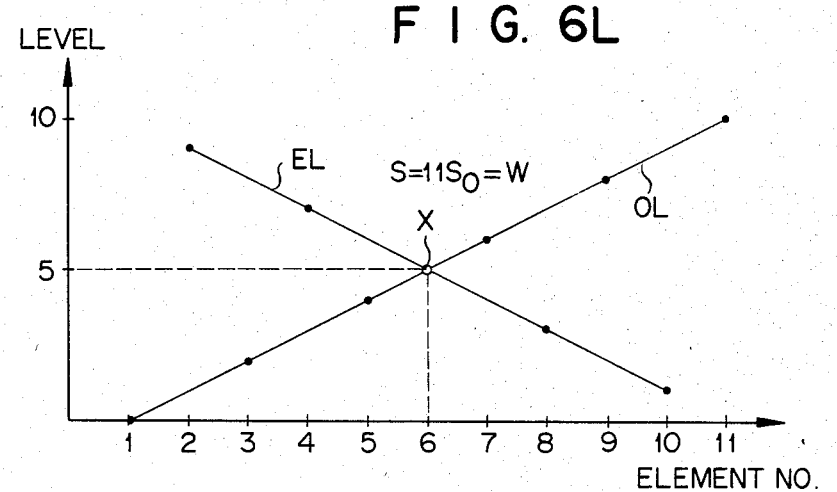
Figure 6M:
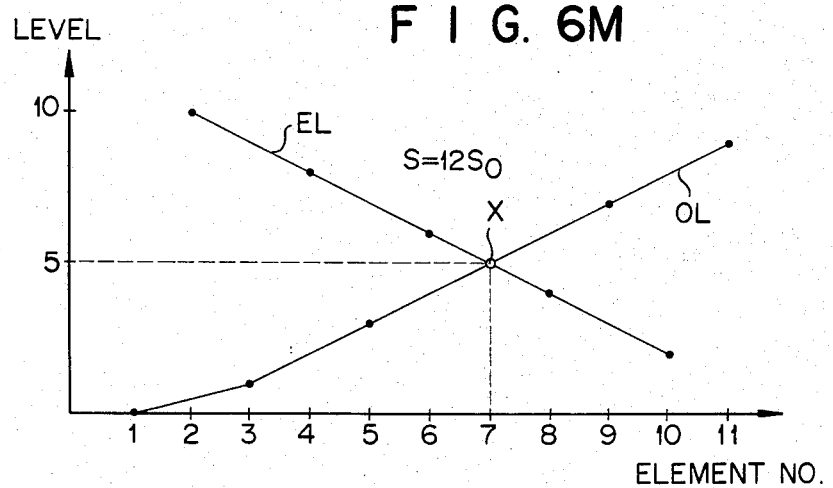

FIGS. 6A, 6B, 6L and 6M illustrate in enlarged manner the graphs of FIGS. 5A, 5B, 5L and 5M. In those figures, the output levels of those elements are illustrated separately for odd-numbered elements $16_1$, $16_3$, $16_5$, . . . and even-numbered elements $16_2$, $16_4$, $16_6$, . . . ; an output level variation of the odd-numbered elements is represented by an odd number envelope line OL and that of the even-numbered elements by an even number envelope line EL. In FIG. 6A, an output level variation of all the serial elements is represented by an envelope line WL. As seen from FIG. 6A, the envelope line WL oscillates with $\frac{1}{2}$ period corresponding to the interval (pitch) between the adjacent elements 16. The oscillation of the line WL gradually damps and its phase is inverted at the point of the element number 6. From this point, the oscillation gradually grows. In other words, the oscillation from the element number 1 to 6 and that from 6 to 11 are opposite in the phase relation, as shown. When there is no phase inversion in the oscillation, the envelope line WL for the elements of the number 6 and its succeeding is depicted by the broken line in FIG. 6A. For this reason, the point X providing the output level "5" will be referred to as "phase inverting point".

Figure 7:
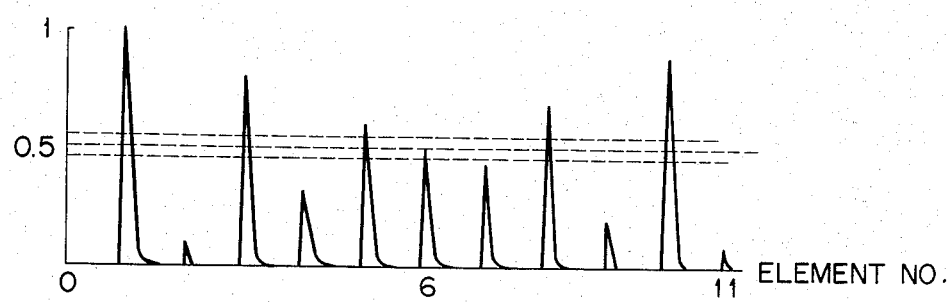
FIG. 7 shows a graph illustrating wave forms of the photoelectric converted output signal produced from the elements 16 of the linear sensor 14.

Three methods are conceivable to determine the phase inverting point X from the graphs shown in FIGS. 6A, 6B, 6L and 6M. The first method is to obtain the cross point of the odd number envelope line OL and the even number envelope line EL. The second method is to detect the phase inversion of the oscillation of the envelope line WL. The third method is to detect a given range of level, for example, 45% to 55% of the maximum output level. More specifically, the peak levels of the pulse signals (optoelectric converted outputs) produced from the linear sensor 14 are discriminated within a range of 50±5% of the maximum level, as shown in FIG. 7. By detecting the element $16_6$ providing the pulse within this level range, the phase inverting point X is determined. The details of those three methods will be described later.

As described above, by detecting the phase inverting point X, a scale division of the scale marked on the code plate 10 or one pitch W of the pattern 12 may be divided into fractions each of 1/(N+1). In other words, the interpolation of 1/(N+1) one slit is possible. Further, the position of the phase inverting point X is determined by only the relative position of the patterns 12 to the elements 16. In other words, even when the linear sensor 14 and the code plate 10 are at a standstill, the phase inverting point X may be detected. As seen from the foregoing, the interpolation according to the invention is the absolute interpolation.

The principle of the interpolation according to the invention is as mentioned above. The coarse reading with the minimum scale value of the pitch W is performed by detecting the boundary between the transparent slit and non-transparent slit. In other words, the coarse reading with the minimum scale value W is performed by using the patterns 12 and the vernier reading with the minimum scale value So=W/(N+1) is performed by the above-mentioned interpolation.

OPTICAL INSENSITIVE ZONE

Figure 8A:
FIGS. 8A and 8B schematically illustrate a relation of the code plate 10 of the linear sensor 14 when the elements 16 have optical insensitive zones l.
Figure 8B:
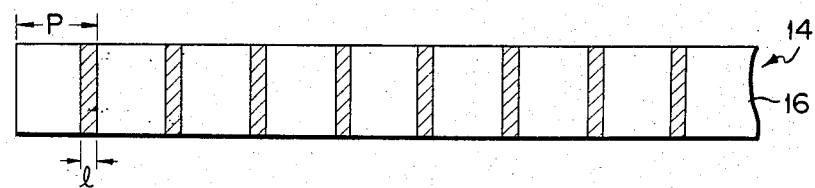
Figure 10A:
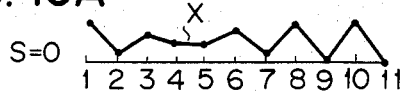
FIGS. 10A to 10F are graphs for illustrating level distributions of the output signals produced from the elements 16 when the displacement S shown in FIG. 9 are 0, So, 2So, 11So, 12So and 13So.
Figure 10D:
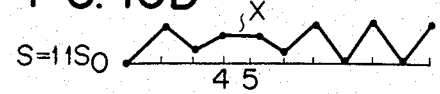
Figure 10B:
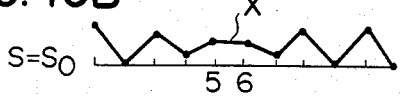
Figure 10E:
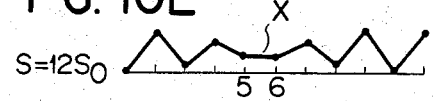
Figure 10C:
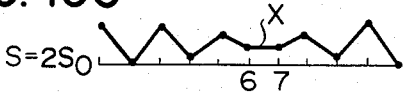
Figure 10F:
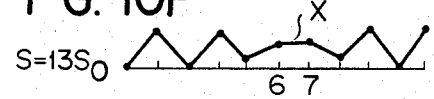
Figure 11A:
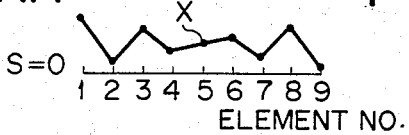
FIGS. 11A to 11J are graphs illustrating level distributions of the output signals produced from the elements when the displacements S are 0, So, 2So, ... 9So, in which P=NW/(N−1)
Figure 11F:
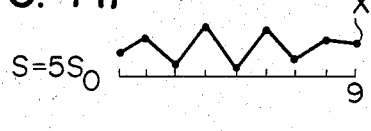
Figure 11B:
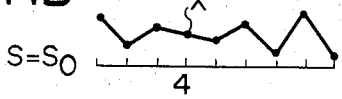
Figure 11G:
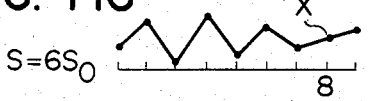
Figure 11C:
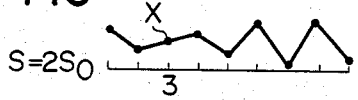
Figure 11H:
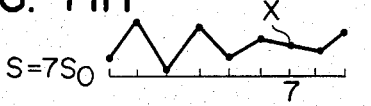
Figure 11D:
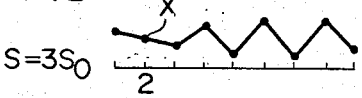
Figure 11I:
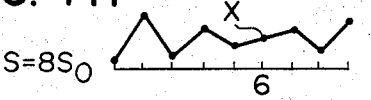
Figure 11E:
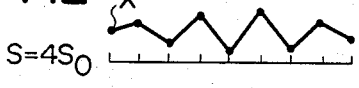
Figure 11J:
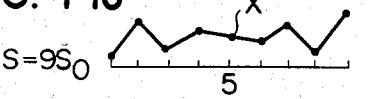

In an actual linear sensor, the sensor elements are mechanically segmented so that the linear sensor has inevitably optical insensitive zones between each element. With the assumption that the width (pitch) between the adjacent elements 16 corresponding to the slit width (pitch) W of the patterns 12 is designated by P, the width 1 within the width P indicates the optical insensitive zone as shown in FIG. 8B. Such insensitive zones will be described in brief. The width 1 is a multiple of the length unit So, as given by $$1 = \alpha So \tag{4}$$

where $\alpha$ is a proportional constant. From the equations (3) and (4), we have $$1 = \alpha/N \times P \tag{5}$$

Assume that N=10 and $\alpha$=3. From the equation (5), 1=0.3 P. This means that the respective elements 16 of the linear sensor 14 have each 30% of the light receiving area as the optical insensitive zone. Even if the linear sensor with such elements is used, it is possible to detect the phase detecting point X, as described later.

FIGS. 9A to 9N illustrate relative positions of the code plate 10 to the linear sensor 14 when an optical insensitive zone of 30% is included in the elements $16_1$ to $16_{11}$. In those figures, the slanted segments designate the optical insensitive zones. Numerals marked in square blocks of the elements $16_1$ to $16_{11}$ denote light receiving areas i.e., the amount of light received by each element. In the figures, when the element is entirely illuminated, its state is represented by "7".

PHASE INVERTING POINT

Turning now to FIGS. 10A to 10F, there are shown optoelectric converting output level distributions of the photosensor elements 16 for the displacements S of 0, So, 2So, 11So, and 13So. (The displacement 13So is not illustrated in FIG. 9). In FIGS. 10A to 10F, the points denoted as X are phase inverting points. As referred to relating to FIG. 9, when the phase inverting point X is determined by obtaining the cross point of the odd number envelope line OL and the even number envelope line EL, the fragmental numbered element is obtained. For example, the cross point of the odd number envelope OL and the even number envelope EL for a case S=0 provides the phase inverting point X at the position of the 4.5th element. In the present embodiment, however, such an element does not exist in actuality. The phase inverting point X is accordingly determined by the 4th or the 5th element $16_4$ or $16_5$. In this case, the elements providing the phase inverting points X moves sequentially in the order of $16_4$, $16_5$, $16_6$, ... or $16_5$, $16_6$, $16_7$... in accordance with 0, So, 2So, .... The essential feature here is that output level changes of the elements 16 each corresponding to the displacement S with the step So are merely detected.

The description heretofore made relates to the case in which the relationship between the pitch P of the element 16 and the pitch W of the pattern 12 is given by the equation (1). Many other relationships than the above, however, are conceivable. Two optical examples of them will be given below in brief.

A first example allowing the following relation to hold follows.

$$P=NW/(N-1) \quad (6)$$

The optical insensitive zone of the photosensor element 16 mentioned above is not considered in this example for ease of explanation. That is, $\alpha$ in the equation (4) is assumed to be zero. In the equation (6), if N=10, 9 photosensor elements correspond to 10 slits of the patterns 12. That is, 9 elements suffice for the necessary number of the elements 16. FIGS. 11A to 11J show optoelectric converted output level distributions of the photosensor elements 16 for the displacements S or 0, So, 2So, ... 9So, respectively. As seen from those figures, even in case $P=NW/(N-1)$, the phase inverting point X may be detected. In this case, the shifting direction of the phase inverting point X of $P=NW/(N-1)$ is opposite to that of $P=NW/(N+1)$. For the displacements S=0, So, 2So, ..., the elements to permit the phase inverting point X to be detected are $16_5$, $16_4$, $16_3$, .... The inversion of the shifting direction of the phase inverting point is not contradictory to the principle of the interpolation according to the invention. If only the phase inverting point X is detected, the absolute interpolation of the one pitch W of the pattern 12 or the one pitch P of the element 16 may be performed.

A second example allowing the following relation to hold follows.

$$P=NW/(N+2) \quad (7)$$

Here, the $\alpha$ in the equation (4) is assumed to be 2. In this example, the optical insensitive zone is considered. In the equation (7), if N=10, 12 photosensor elements correspond to 10 slits of the patterns 12. That is, the number of elements 16 used is 12. FIGS. 12A and 12L show output level distributions of the elements $16_1$ to $16_{12}$ for the displacements S=0, So, 2So, ... 11So. As seen from those figures, even in case $P=NW/(N+2)$, the phase inverting point X may be detected. In this case, the phase inverting point appears at two points X1 and X2. For example, in the case of S=0 in FIG. 12A, the phase inverting points X1 and X2 appear at the 3.5th and the 9.5th elements. Further, in the case of S=So in FIG. 12B, the phse inverting points X1 and X2 appear at the position of the 4th and the 10th elements. Those phase inverting points X1 and X2 are shifted correspondingly with the displacement S. Accordingly, either X1 or X2, or the mean value $\frac{1}{2}$ (X1+X2) may be used for the phase inverting point X for the interpolation.

In summary, if the number of the elements 16 within a given range of the linear sensor 14 is different from the number of the slits of the patterns 12 on the code plate 10 corresponding to the elements 16 within the same range, the absolute interporation according to the invention is possible.

The description thus far made refers to the case using the code plate 10 and the linear sensor 14 as shown in FIG. 1. Evidently, the same thing is true for the case of the code disc 10a and the linear sensor 14a as shown in FIG. 2. The use of the code disc 10a and the linear sensor 14a enables the interpolation of minute angles.

CIRCUIT ARRANGEMENT OF ENCODER

Figure 13:
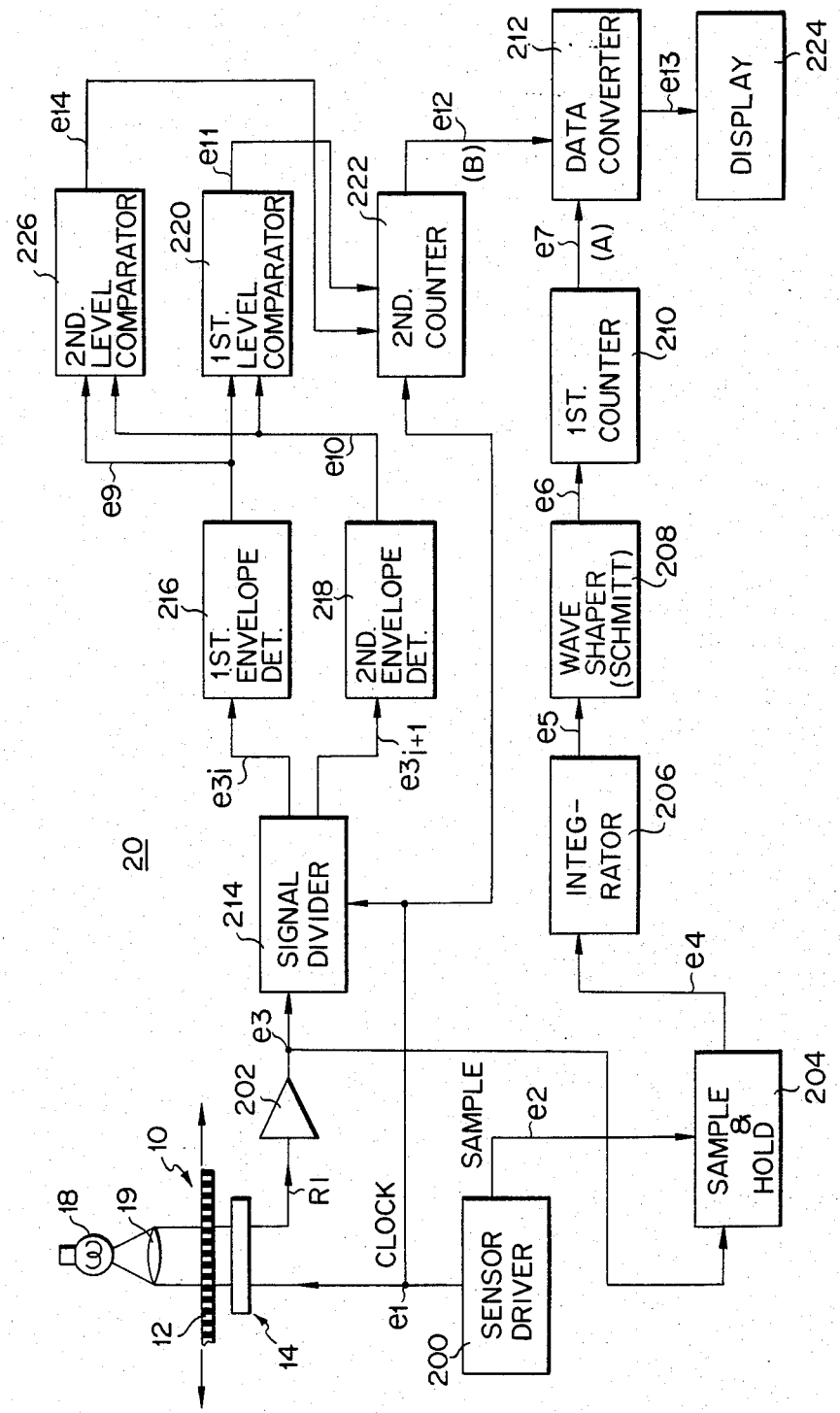
FIG. 13 shows a block diagram of an encoder according to the invention in which the coarse reading is performed in an incremental method and the vernier reading or the interpolation is performed in the absolute method.

Reference is made to FIG. 13 illustrating an embodiment of an encoder constructed on the basis of the interpolation principle according to the invention. A code plate 10 is coupled with an object of which an amount of displacement is measured, for example, a rectilinearly or angularly movable table of a machine tool, or a fine feeding table of a microscope. The linear sensor 14 is arranged in parallel with the code plate 10. C series solid-state line scanners by RETICON COP. USA, for example, may be used for the linear sensor 14. A modification of the charge coupled device may also be used for the same. The linear sensor 14 is fixed while the code plate 10 is movable with the movement of the object. The light rays emanating from a lamp 18 are collimated by a lens 19 and are vertically incident upon photosensor elements 16 (not shown) of the linear sensor 14, through the code plate 10.

A pattern of light rays irradiated onto the linear sensor 14 through the code plate 10 corresponds to a pattern formed on the code plate 10. Assume now that the code plate 10 and the linear sensor 14 have the sizes as shown in FIG. 14. The code plate 10 has binary grating patterns 12 in which 10 slits with the pitch W=10 $\mu$m 100 $\mu$m. The linear sensor 14 has 11 photosensors elements 16 with the pitch P≈9 $\mu$m within 100 $\mu$m. This corresponds to the case where N=10 in the equation (1). When a relative position or a relative phase of the code plate 10 to the linear sensor 14 are as shown in FIG. 14, optoelectric outputs or reading data RI (serial data) produced from the linear sensor 14 take a wave form as shown in FIG. 15A. The wave form successively changes in accordance with the relative phase of the code plate 10 to the linear sensor 14. After relative movement or displacement is made by one period (20 $\mu$m) of the pattern 12, the wave form is restored to the one shown in FIG. 15A.

The encoder shown in FIG. 13 employs the above-mentioned absolute method for the vernier reading or the interpolation and an incremental method for the coarse reading or the reading of the minimum scale value (pitch 10 $\mu$m) of the code plate 10.

The coarse reading follows. An output level of one of the photosensor elements $16_1$ to $16_{11}$ of the linear sensor 16 oscillates in a sine or a cosine manner with the relative movement of the code plate 10 to the linear sensor 14. This is seen from the rows in Table 1. In the case of the element $16_1$, for example, when S=0 (phase angle 0), the output level is "10". When S=6 (phase angle $\pi/2$), the output level "5". Further, the output level "0" for S=11 (phase angle $\pi$). Thus, the output level oscillates in cosine manner with respect to the output level "5" within ±5. In other words, the output produced from each element $16_1$ and $16_{11}$ for each scanning of the linear sensor 14 varies with a sine or cosine oscillation with one period of the relative movement 2W.

The linear sensor 14 is sequentially scanned in synchronism with a clock pulse e1 applied from a sensor driver 200. The linear sensor 14 produces reading data RI having level distributions in the columns in Table 1. In the state shown in FIG. 14, the reading data RI is illustrated a train of pulses e3 as shown in FIG. 15A. The pulse train is in synchronism with the clock pulse e1. The data RI is applied to a sample/hold circuit 204, through an amplifier 202.

The circuit 204 is supplied with a sample pulse e2 from the sensor driver 200. The sample pulse e2 is produced, for example, in the following manner. The sensor driver 200 is comprised of a counter which counts the clock pulse e1 and is reset every scanning of the linear sensor 14, a register for storing a given value, and a comparator for comparing the counts of the counter with the given value of the register. When the count is coincident with the given value, the comparator produces the sample pulse e2. When a given value "3" is stored in the register, the sample pulse e2 is obtained at the timing of third clock pulse e1 for each scanning of the linear sensor 14. The pulse e2 may also be obtained by using a 11-scale presetable counter or programmable counter.

The circuit 204 samples and holds a signal e3 corresponding to the data RI applied from the amplifier 202 by the sample pulse e2 as mentioned above. If the pulse e2 is produced at the time of the third timing in one scanning, for example, the circuit 204 samples and holds the data or the signal e3 outputted from the third element $16_3$ every scanning of the linear sensor 14. The signal e3 sampled and held by the circuit 204 is applied as a signal e4 to an integrator 206 formed by a R-C integrator circuit, for example. The integrator 206 produces a signal e5 corresponding to the envelope of the signal e4, with a proper time constant corresponding to the sample interval in the circuit 204. The signal e5 is the sine wave signal with one period of the relative movement 2W as mentioned above.

The signal e5 is converted into a rectangular wave signal e6 by a wave shaper 208 of a Schmidt trigger circuit, for example. The wave shaper 208 is triggered at the level of 50%, for example, of the signal e5 thereby to produce a rectangular wave signal e6. The leading and the trailing edges of the signal e6 are counted by a first counter 210. The length from the leading edge of the signal e6 to the trailing edge corresponds to the slit width W of the code plate 10 one for one, as shown in FIG. 14. Therefore, it is possible to measure a displacement of the code plate 10 with an unit of the slit width W from the count of the counter 210.

The counter 210 counts the edges of the signal e6 during a period that the code plate 10 moves. When the movement of the code plate stops, the counting of the counter 210 also stops. A signal e7 outputted from the counter 210 is coarse reading data with the minimum unit W. The signal e7 is converted by a data converter 212 into an amount of actual displacement of the code plate 10.

The count direction of the counter 210, that is to say, whether the counter 210 counts up or down the edges of the signal e6, is judged in the following manner. For example, a signal $e6_3$ or a sine wave oscillation derived from the element $16_3$ is shifted in phase from a signal $e6_5$ or a sine wave socillation produced from the element $16_5$. The phase angle, when an output signal of level "5" is obtained from the element $16_3$, is $8/11\pi$ (S=8So). The phase angle, when an output signal of level "5" is obtained from the element $16_5$, is $10/11\pi$ (S=10So). Accordingly, when the code plate 10 moves in a direction that the relative movement S increases, the signal $e6_5$ advances in phase ahead the signal $e6_3$. On the other hand, when the code plate 10 moves in an opposite direction, i.e. in which the displacement S decreases, the signal $e6_3$ advances in phase ahead the signal $e6_5$. By investigating the phase relation between the signals $e6_3$ and $e6_5$ in this manner, the count mode may be determined. When the signal $e6_5$ is in a state of phase-advance, the counter 210 is in an up-count mode, while, when the signal $e6_3$ is in the same state, it is in a down-count mode.

Alternately, by additionally using a switch switched in accordance with the moving direction of the code plate 10, the count mode of the counter 210 may be switched. The coarse reading, i.e. the minimum scale reading, by the encoder shown in FIG. 13 is performed as mentioned above.

The vernier reading or the interpolation by the encoder will be described hereinafter.

The signal e3 as shown in FIG. 15A outputted from the amplifier 202 is applied to a signal divider 214. The divider 214 divides the signal e3 into a signal $e3_i$ derived from an odd-numbered element of the linear sensor 14 and a signal $e3_{i+1}$ derived from an even-numbered element (i=1,3, 5, . . . ). The circuit construction of the divider 214 is as shown in FIG. 16, for example. As shown, the signal e3 is inputted to first and second analog switches $214_1$ and $214_2$. The switches $214_1$ and $214_2$ are switched in accordance with the logic levels at the ouput Q and $\overline{Q}$ of a toggle flip-flop (T.FF) $214_3$.

The T.FF $214_3$ is preset or initialized every scanning of the linear sensor 14 at the start of the scanning. At the timing that the output of the element $16_1$ is taken out, the T.FF $214_3$ is set to Q=1 and $\overline{Q}=0$. At this time, the switch $214_1$ is open and the switch $214_2$ is closed, so that a signal $e3_1$ corresponding to the element $16_1$ is derived from the switch $214_1$. When a single clock pulse e1 is applied to the T.FF $214_3$, the T.FF $214_3$ is set to Q=0 and $\overline{Q}=1$. At this time, the switch $214_1$ is closed and the switch $214_2$ is open so that a signal $e3_2$ corresponding to the element $16_2$ is derived from the switch $214_2$. Similarly, the switch $214_1$ produces signals $e3_1$, $e3_3$, $e3_5$, . . . $e3_i$ corresponding to the odd-numbered elements $16_1$, $16_3$, $16_5$, . . . . The switch $214_2$ produces signals $e3_2$, $e3_4$, $e3_6$, . . . , $e3_{i+1}$ corresponding to the even numbered elements $16_2$, $16_4$, $16_6$, . . . .

Figure 16:
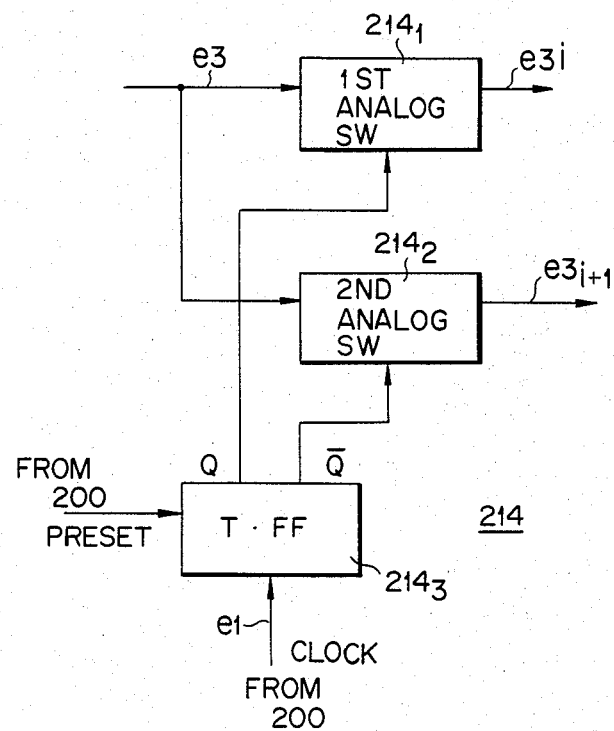
FIG. 16 shows a block diagram of a signal divider used in the circuitry shown in FIG. 13.
Figure 17:
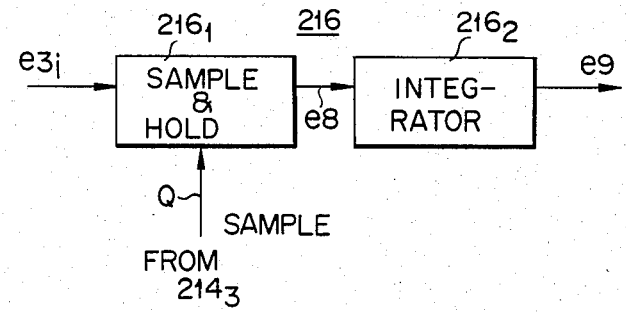
FIG. 17 shows a block diagram of the envelope detector used in the circuitry shown in FIG. 13.

The signals $e3_i$ and $e3_{i+1}$ are inputted to first and second envelope detectors 216 and 218, respectively. The detector 216 produces a signal e9 corresponding to the envelope OL of the signal $e3_i$ and the detector 218 produces a signal e10 corresponding to the envelope EL of the signal $e3_{i+1}$. The detector 216 has a sample/hold circuit $216_1$ and an integrator $216_2$, as shown in FIG. 17. The signal $e3_i$ is sampled every two pulses of the clock pulse e1 in the circuit $216_1$. The sampling timing is determined in the output Q of the T.FF $214_3$ shown in FIG. 16. A signal e8 sampled and held by the circuit $216_1$ is integrated by the integrator $216_2$ and converted into the signal e9. The detector 218 also may be constructed with exactly the same construction as that of the FIG. 17. The output $\overline{Q}$ of the T.FF $214_3$ is used for sampling in the detector 218.

The signals e9 and e10 are inputted into a first level comparator 220. The comparator 220, when the signals e9 and e10 are coincident with each other, produces a signal e11 for transmission to a second counter 222. The counter 222 starts its counting of the clock pulse e1 from at a pregiven start point. The counter 222 counts the clock pulses e1 inputted from an instant that the scanning of the linear sensor 14 starts until the signal e11 is applied to the counter 222. Specifically, from the scanning start point of the linear sensor 14 until the envelope OL (e9) and EL (e10) are coincident with each other, that is to say, during a time period until the phase inverting point X is detected, the counter 222 counts 6 clock pulses e1. The output "6" of the counter 222 corresponds to the displacement S=0 shown in Table 1. Accordingly, the S=So, 2So, 3So, . . . ; 7, 8, 9, . . . are the counts of the counter 222. Where So corresponds to W/11, this indicates that the reading of the count of the counter makes a vernier reading of 1/11 subdivisions of the minimum scale W for the coarse reading. The count of the counter 222 depends only on the position of the phase inverting point X and therefore the vernier reading or the 1/11 interpolation is the absolute interpolation.

The count of the counter 222 is applied as a signal e12 to the data converter 212. The converter 212, depending on the count of the counter 210 or the signal e7 and the signal e12 or the count of the counter 222, produces a signal e13 representing a measurement of a length. The signal e13 is inputted to a display unit 224 where the measured length is displayed with minimum units each of W/11, or with the precise resolution of W/11.

Figure 18:
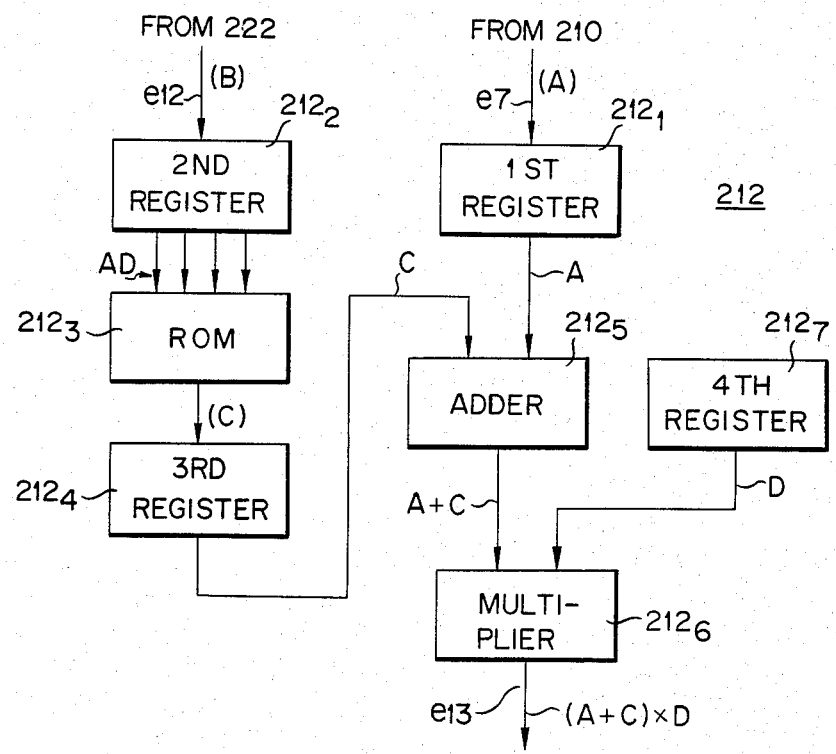
FIG. 18 shows a block diagram of a data converter used in the encoder shown in FIG. 13.

FIG. 18 shows an example of the circuit construction of the converter 212 shown in FIG. 13. The count of the first counter 210 is assumed to be data A and the count of the second counter 222 data B. The data A represents the count by the coarse reading and the data B count by the vernier reading. The data A and B are set in first and second registers $212_1$ and $212_2$. The register $212_2$ provides address data AD corresponding to the data B for transfer to a ROM $212_3$. Then, the ROM $212_3$ produces the interpolation data C corresponding to data AD. The ROM $213_3$ stores data as shown in Table 2, for example.

TABLE 2

| ADDRESS DATA AD | STORED DATA C |
|---|---|
| 1 | 6/11 |
| 2 | 7/11 |
| 3 | 8/11 |
| 4 | 9/11 |
| 5 | 10/11 |
| 6 | 0 |
| 7 | 1/11 |
| 8 | 2/11 |
| 9 | 3/11 |
| 10 | 4/11 |
| 11 | 5/11 |

For ease of understanding, Table 2 expresses address data AD and stored data C in the terms of decimal numeration system. In Table 2, numerals of data AD column designate each the number of bits until the phase inverting point X is detected from the first element $16_1$ of the linear sensor 14. When AD=7, for example, the phase inverting point X is detected from the element $16_7$ at the seventh bits. In this case, the relative displacement S of the code plate 10 to the linear sensor 14 is S=So. Therefore, the interpolation value is W/11 as seen from Table 2.

The data C read out from the ROM $212_3$ is set in a third register $212_4$. The data C set in the register $212_4$ is inputted to an adder $212_5$, together with the data A set in the register $212_1$. The adder $212_5$ applies the result of the addition A+C to a multiplier $212_6$ as a multiplicand. To the multiplier $212_6$ converting data D from a fourth register $212_7$ is inputted as a multiplier factor. Multiplied by the data D, the addition result A+C is converted into measured data (A+C)×D or the signal e13 representing a length (or angle). In the example of FIG. 14 having 10 μm for W, if the data D is "10" and the unit for data display in the display unit 224 is μm, the display unit 224 displays a displacement of the code plate 10 with the minimum of 10/11 micron as a unit.

The interpolation mentioned above concerns with the pitch W. In the above-mentioned case, eleven elements are sufficient for the linear sensor 14. The interpolation can also be made for one period, i.e. pitch 2W, of the patterns 12 of the code plate 10, wherein double sensor elements or twenty-two sensor elements, for example, are used for the linear sensor 14. In the one-period interpolation, two phase inverting points X are detected as shown in FIGS. 15A and 15B. One phase inverting point X should be distinguished from the other point X and detected for the interpolation. The distinction of two points X may be made by a second level comparator 226.

Here let a level change point from e10>e9 to e10<e9 around the point X be defined as "normal phase inverting point", and a level change point from e10<e9 to e10>e9 as "anti-phase inverting point". Suppose the normal phase inverting point X is watched. The comparator 226 compares the levels of the signals e9 and e10. It supplies a signal e14 to the counter 222 when the levels of e9 and e10 are found equal. The counter 222 is stopped by the trailing edge of the signal e14. That is, the counter 222 counts 16 clock pulse e1 until the normal phase inverting point X is detected. In this case, since the counter 222 counts 22 pulses e1, Table 3 should be used in place of Table 2.

TABLE 3

| ADDRESS DATA AD | STORED DATA C |
|---|---|
| 1 | 17/11 |
| 2 | 18/11 |
| 3 | 19/11 |
| 4 | 20/11 |
| 5 | 21/11 |
| 6 | 0 |
| 7 | 1/11 |
| 8 | 2/11 |
| 9 | 3/11 |
| 10 | 4/11 |
| 11 | 5/11 |
| 12 | 6/11 |
| 13 | 7/11 |
| 14 | 8/11 |
| 15 | 9/11 |
| 16 | 10/11 |
| 17 | 11/11 |
| 18 | 12/11 |
| 19 | 13/11 |
| 20 | 14/11 |
| 21 | 15/11 |

TABLE 3-continued

| ADDRESS DATA AD | STORED DATA C |
|---|---|
| 22 | 16/11 |

Thus the interpolation for one period means that the unit of the coarse reading is pitch 2W. Such one-period interpolation has further important advantage. In the embodiment of the invention each coarse reading data and vernier reading data (interpolation data) is obtained from the independent method. For this, the coarse and vernier reading data should be added. Accordingly a measuring error may be produced around the changing point of coarse reading data or vernier reading data. If the absolute data "1000.0", for example, is to be measured, the coarse reading data obtained may be "999" or "1000", and the vernier reading data may be "10/11" or "0/11". Addition of the coarse and vernier data may provide not only "999+10/11" or "1000.0" but also "999.0" or "1000+10/11". Such an undesirable phenomenon can be avoided by a place correction in which the minimum scale of coarse reading is defined within the interpolation range. The most preferable example of the place correction is that the minimum scale of coarse reading is defined by pitch W and the interpolation range pitch 2W.

Figures 15E, 15F:
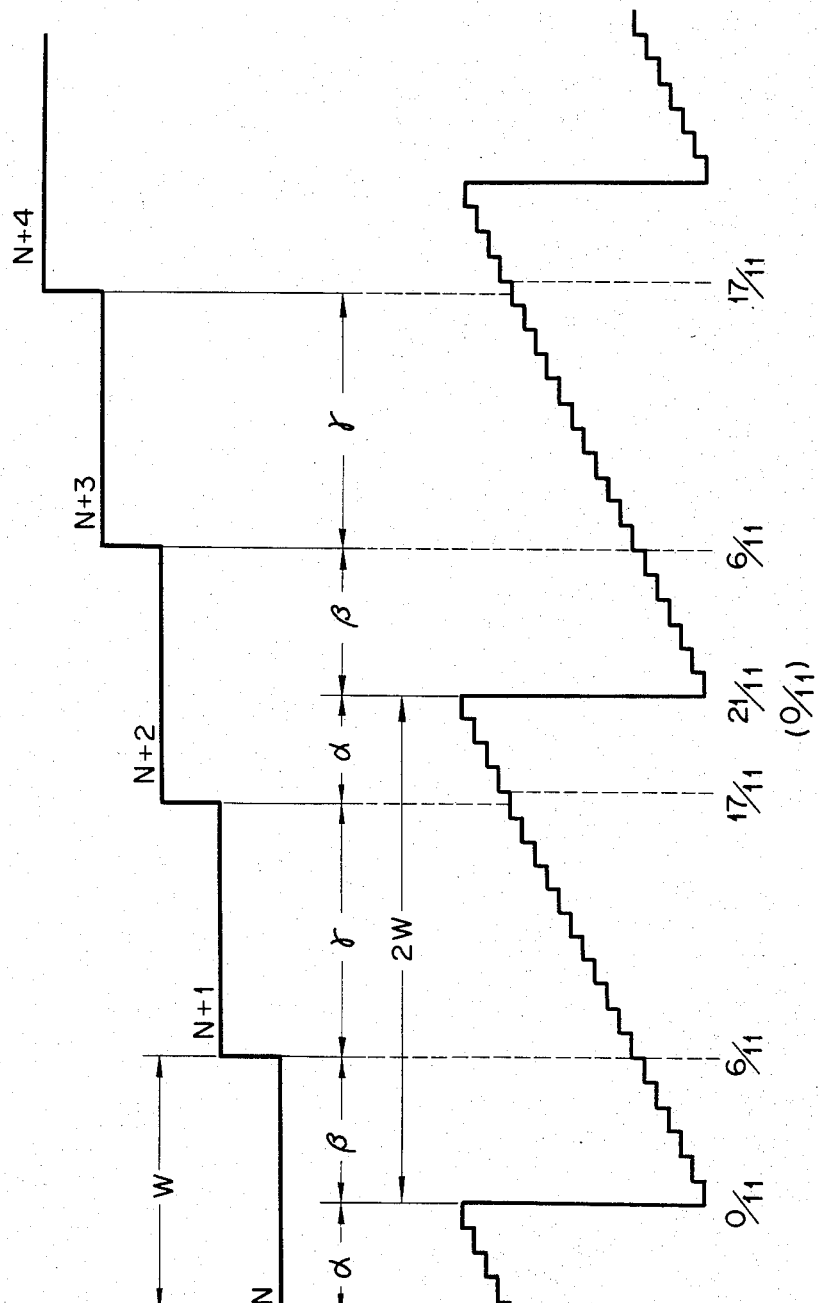
FIG. 15E shows the coarse reading data of which the value is increased by "1" with the increment of displacement W.
FIG. 15F shows the vernier reading data of which the value is increased by "1/11" from "0/11" to "21/11" within the interpolation range 2W.

FIG. 15E shows the coarse reading data of which the value is increased by "1" with the increment of displacement W. In FIG. 15E, "N" denotes an even number. (It will later be described why an even number is used.) FIG. 15F shows the vernier reading data of which the value is increased by "1/11" from "0/11" to "21/11" within the interpolation range 2W. In these figures the changing point of the vernier reading data ("21/11" to "0/11") is shifted from that of the coarse reading data ("N" to "N+1"). This means that the place shift-up or increment point of the coarse reading data appears at the boundary between white and black slits of said code plate 10 and that the changing point of the vernier reading data appears around the center portion of the white or black slit so that the vernier reading data becomes "0/11" around the center portion, thereby the changing point of the vernier reading data will appear around the displacement W/2. This changing point is defined by positioning a reference point in the case of incremental coarse reading. At the reference point, for example, a coarse reading data is defined by "0/11", the changing point of vernier according data occurres at the even numers of coarse reading data N.

FIG. 15G shows the program flow of measuring in the above-mentioned case. In FIG. 15G "A" denotes a coarse reading data, "C" a vernier reading data and "D" a given multiplier data. First, in step 10, it is judged whether the content of data A is even or odd. If the data A is even, it is judged in step 12 whether the content of data C is larger than "1" or not. If the data C is found larger than "1"—this indicates that the changing point of vernier reading data appears between the range $\alpha$ as shown in FIGS. 15E and 15F—numerical data "2" is subtracted from data A and vernier reading data C is added to data A in step 14. Then the resultant of step 14 is multiplied by given multiplier data D in step 16, thus providing calculated data $(A-2+C)\times D$ or a signal e13.

If data A is even and data C is below "1" in step 12—this means that said changing point appears between the range $\beta$ as shown in FIGS. 15E and 15F—data C is added to data A in step 18. The resultant of step 18 is multiplied by data D in step 16, thereby providing measured data $(A+C)\times D$.

If data A is found odd in step 10—this means that said changing point appears between the range $\gamma$ as shown in FIGS. 15E and 15F—numerical data "1" is subtracted from data A and data C is added to data A in step 20. The resultant of step 20 is multiplied by data D in step 16, thus providing calculated data $(A-1+C)\times D$ is obtained.

By changing the calculation of measured data according to the current data of A and C as mentioned above, the aforesaid measuring error can be avoided. The measured data "999+10/11" or "1000.0" will therefore be provided with respect to the absolute position "1000.0".

The program flow shown in FIG. 15G can be executed by the data converter 212 shown in FIG. 18. The converter 212 comprises a register $212_1$ including a judgement circuit for judging the step 10 and a register $212_4$ including a judgement circuit for judging the step 12. According to the judgement data "A-2", "A-1" or "A" is added to data C by the adder $212_5$.

If said reference point is placed at a given position so that the coase reading data becomes "0" at the black slit, the changing point of vernier reading data occurs when coarse reading data contains odd numbers. In this case, the resultant at step 10 in FIG. 15G should be exchanged. That is, the resultant "YES" at step 10 leads step 20 and "NO" leads step 12.

Further, if the changing point of vernier reading data coicides with the place shift-up point, said place correction may also be performed by judging the contents of coarse and vernier reading data.

As mentioned above, it is judged whether the content of data A, which corresponds to the count value of the changing points of the slits, is even or odd. Instead, the following judgement may be made. First, the count value of the changing points of the slits is converted to the actual value of displacement or angle. Then, it is judged whether the converted actual value is even times or odd times as much as the actual unit value corresponding to the coarse reading pitch.

Furthermore, in the above explanation, an incremental method is applied to the coarse reading. This explanation, of course, may be applied to an absolute method described later concering with FIG. 36A. The point is that the vernier reading may be done with a larger period than W when the pitch W is used for the coarse reading. Instead, the interpolation range, however, may correspond to a pitch different from 2W. For example, an interpolation range corresponding to pitch 2.2W may be applied to the linear sensor 14 for the actual interpolation of 2W.

FIG. 19 shows a circuit construction of a modification of the construction shown in FIG. 13. FIG. 19 illustrates only the construction for the vernier reading or the interpolation since the construction for the coarse reading is the same as that of FIG. 13. Explanation will be given of the operations different from those in FIG. 13. The output signal e3 produced from the amplifier 202 is inputted to an envelope detector 217. The construction of the detector 217 may be the same as that of the FIG. 17 one. The sampling and the holding operations are performed for each pulse of the clock pulse e1. Upon those operations, the detector 217 produces a signal e30 with a sine wave oscillation as shown in FIG. 21D, for example. The signal e30 is applied to a phase inverting discriminator 230.

Figure 20:
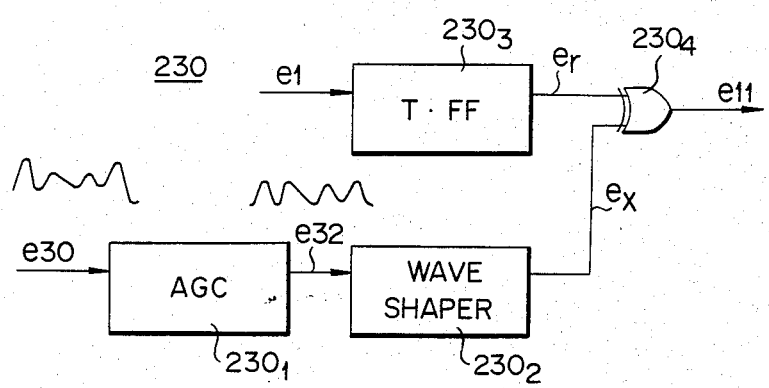
FIG. 20 shows a block diagram of a phase inversion discriminator 230 used in the construction shown in FIG. 19.

The discriminator 230 may be constructed as shown in FIG. 20, for example. The signal e30 is applied to an automatic gain control (AGC) amplifier 230₁ where it is converted into a signal e32 with a substantially constant amplitude. The signal e32 is further applied to a wave shaper 230₂ where it is wave-shaped to be a comparing signal $e_x$ as shown in FIG. 21C. The wave shaper 230₂ may be constructed by a bistable multivibrator which is triggered at the inflection point of the amplitude of the signal e32, for example. Applied to the discriminator 230 is the clock pulse e1 as shown in FIG. 21A. The pulse e1 is inputted to a toggle flip-flop 230₃ (T.FF) which in turn produces a reference signal $e_r$ as shown in FIG. 21B. When the edges of the signals $e_r$ and $e_x$ are not coincident with each other in a time relation, a phase shifter (not shown) is inserted in the signal path of either the signal $e_r$ or $e_x$ to make them coincident. The signals $e_r$ and $e_x$ are applied to an EXOR gate 230₄.

As seen from FIGS. 21A to 21E, before the phase inverting point Xa the logic levels of the signals $e_r$ and $e_x$ are coincident with each other, so that the output signal e11 of the EXOR gate 230₄ is at "0" level. At the phase inverting point Xa, the logic levels of the signals $e_r$ and $e_x$ are opposite to each other so that the output signal e11 of the EXOR 230₄ becomes "1" in logic level. Thus, by stopping the counting operation of the counter 222 in FIG. 19 at the leading edge of the output signal e11 from the EXOR gate 230₄, the interpolation value may be obtained. When the interpolation is made over the width 2W or within a black slit (e.g. the pattern 12₂ of FIG. 14) of opaque, utilized is the restoration of the logic level of the signal e11 to "0" at the phase inverting point Xb. In other words, the counting operation of the counter 222 is stopped at the trailing edge of the signal e11. The phase inverting points Xa and Xb may be discriminated one from another by checking the logic level of the signal e11 immediately after the phase inverting point X is detected.

In the above-described manner, the contents of the counter 222 counted until the phase inverting point X (Xa or Xb) is detected is applied to the data converter 212 as vernier data.

FIG. 22 shows a modification of the construction shown in FIG. 13 or 19. Also in FIG. 22, only the construction for the vernier reading or the interpolation is illustrated as in the case of FIG. 19. The signal e3 as shown in FIG. 24A, which is outputted from the amplifier 202 is inputted to a wave shaper 232. The wave shaper 232 produces a pulse signal e3 proportional to the peak level of the signal e34, as shown in FIG. 24B. The signal e34 is applied to a pulse level analizer 234, as shown in FIG. 23. The signal e34 is applied to level comparators 234₁ and 234₂. The comparator 234₁ compares a given level E1 with the level of the signal e34. When E1<e34, it produces a signal e36 with logical "1". The comparator 234₂ compares a given level E2 with a level of the signal e34. When e34<E2, it produces a signal e38 of logical "1".

The signals e36 and e38 are applied to an AND gate 234₃. It is when E1<e34<E2 that the signals e36 and e38 are both logical "1". At this time, the AND gate 234₃ produces the signal e11 of logical "1". The magnitudes of the given levels E1 and E2 correspond to 45% and 55% of the maximum level of the signal e34, for example. The analyizer 234 detects the signal e34 of which the level reaches 50% level at the phase inverting point X to produce the signal e11, as shown in FIGS. 24A to 24C. By stopping the counting of the counter 222 in FIG. 22 by the signal e11, the counter 222 produces data corresponding to the interpolation value.

EXAMPLES OF OPTICAL SYSTEMS

FIGS. 25 to 29 show modifications of optical systems coupled with the code plate 10 and the linear sensor 14. The modifications shown in FIGS. 25 and 26 correspond each to the example shown in FIG. 13 with an additional lens 21 disposed between the code plate 10 and the linear sensor 14. In those modifications, by adjusting the magnification by the lens 21, the scale relation between the code plate 10 and the linear sensor 14 may be changed properly. Assume now that the number of slits of pattern 12 is 10 (W=10 microns) within the length of 100 microns and the number of photosensor elements 16 is 10 in the same length of 100 microns (p=10 microns). On this assumption, by adjusting the position of lens 21 so as to form the image of the pattern 12 on the linear sensor 14 is in the magnification factor of 1:1.1, the vernier scale relationship can be established.

Figure 27:
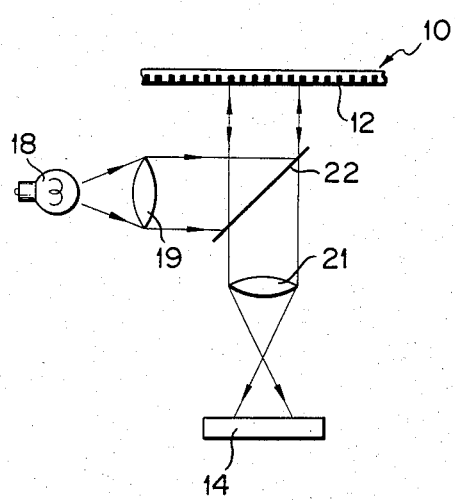

In the example shown in FIG. 27, optical information reflected on the pattern surface 12 of the code plate 10 is applied to the linear sensor 14, through a half-mirror 22 and the lens 21. By adjusting the size of the pattern 12 formed on the linear sensor 14 by using the lens 21, the vernier scale relation may be set up properly.

Figure 28:
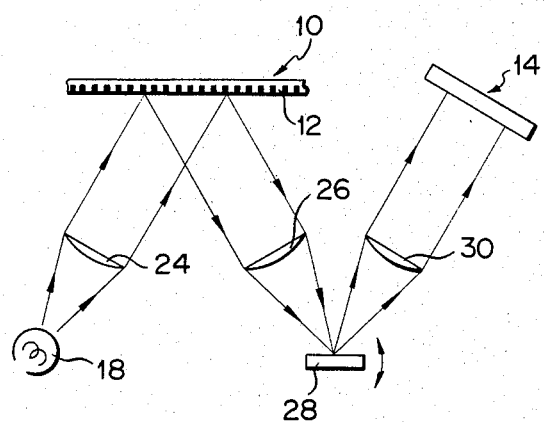

The examples shown in FIGS. 28 and 29 are adaptable for cases where the code plate 10 and the linear sensor 14 are disposed in non-parallel relation. In FIG. 28, light rays emanating from the lamp 18 enter a lens 24 where those are collimated. The collimated ones are incident upon the pattern surface 12 on the code plate 10. The light rays reflected on the pattern 12 surface are collected by a lens 26 and are incident upon a mirror 28. The reflected light rays from the mirror 28 enter a lens 30 and are collimated upon the linear sensor 14.

The example of FIG. 29 corresponds to a case where the reflecting pattern of the pattern 12 in FIG. 28 is replaced by a transmitting light pattern. More specifically, rays emitting from the lamp 18 goes through a half-mirror 22, the lens 24, the code plate 10 and the lens 26 to strike the mirror 28. The incident light upon the mirror 28 returns to the half-mirror 22 through the same passage as the incident light. The return light is reflected by the half-mirror 22 and is incident upon the linear sensor 14.

The measurement of a length (or angle) in the invention is performed through the relative displacement or movement of the photosensor element 16 to the pattern 12 on the linear sensor 14. Therefore, even when the linear sensor 14 and the code plate 10 are fixed, the measurement is possible if the pattern 12 projected on the linear sensor 14 is movable. For example, when the mirror 28 are slightly slanted in FIG. 28, the pattern 12 projected on the linear sensor 14 moves. Therefore, if the mirror 28 is rotated or displaced slightly correspondingly to a length or an angle of an object to be measured, a minute amount of the length or angle change may be measured with a high resolution. The linear sensor 14 may be disposed at the position of the mirror 28. Also in this case, the pattern 12 moving correspondingly with the code plate 10 is projected onto the linear sensor 14.

MODIFICATION OF THE CODE PLATE-LINEAR SENSOR COMBINATION

Figure 31:
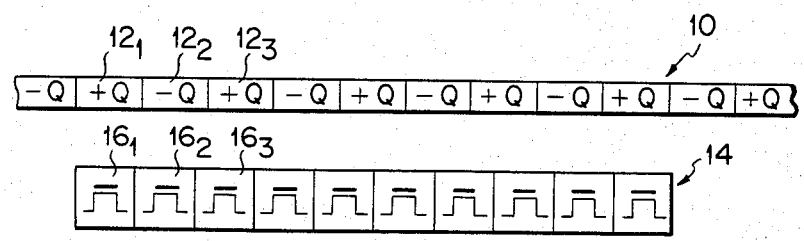
FIG. 31 shows an example using the combination of electret film and a MOS FET array 14 in place of the combination of the code plate and the linear sensor.

Turning now to FIGS. 30 and 31, there are shown modifications of the combination of the code plate 10 and the linear sensor 14. Those modifications are constructed non-optically. In more particularly, in FIG. 30, magnetic poles recorded on a magnetic film is used for the binary grating patterns 12 on the code plate 10. A semiconductor Hall element array is used for the sensor elements 16 of the linear sensor 14. In FIG. 31, the code plate 10 uses an electret charged on a polymer film for the binary grating pattern 12. The linear sensor 14 uses a MOS FET array for the sensor element 16. In those examples shown in FIGS. 30 and 31, the pattern 12 and the element 16 are disposed closely and parallely to each other.

MODIFICATION OF CODE PLATE

The embodiment described referring to FIG. 13 performs the coarse reading of a length or an angle in an incremental method. The encoder according to the invention, however, may be applied for the coarse reading made in an absolute method. An enclocder arrangement capable of making coarse and vernier readings in the absolute method will be described.

Figure 32:
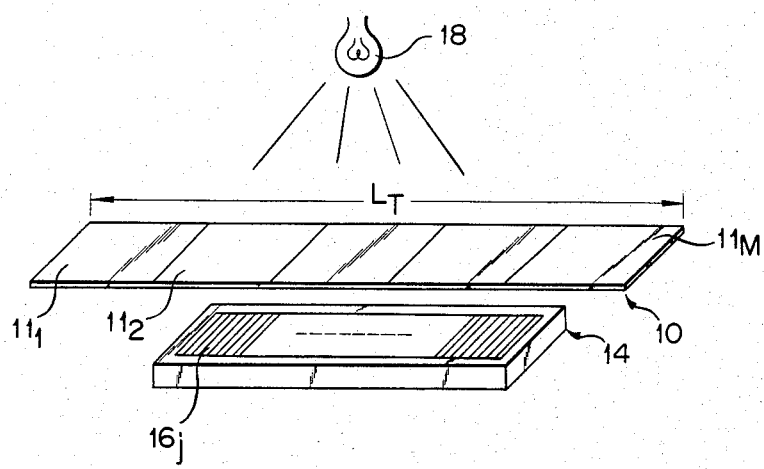
FIG. 32 shows an example of a code plate 10 for forming the coares reading of a length in the absolute method.

As shown in FIG. 32, a code plate 10 with $L_T$ of its total length is divided into M blocks $11_i$ ($i = 1, 2, 3, \ldots$ M). Each block $11_i$ has a block address pattern for indicating an absolute position of the block, a block boundary pattern for indicating the boundary position between the adjacent blocks or the start of the block, and a grating pattern for making the above-mentioned interpolation. The address pattern may employ the binary code pattern. One side (the upper surface) of the code plate 10 is illuminated by a lamp 18. A sensor array or a linear sensor 14 is disposed in parallel with the code plate 10, facing the other side (the lower surface) of the plate 10. The linear sensor 14 has a number of photosensor elements $16_j$ ($j = 1, 2, 3, \ldots N$) regularly arranged in a series. The linear sensor 14 has such a size as to cover the entire of at least one block of the code plate 10. The idea to divide the code plate 10 into a plurality of blocks as shown in FIG. 32 is applicable for the code disc $10a$ as shown in FIG. 2.

Figure 33:
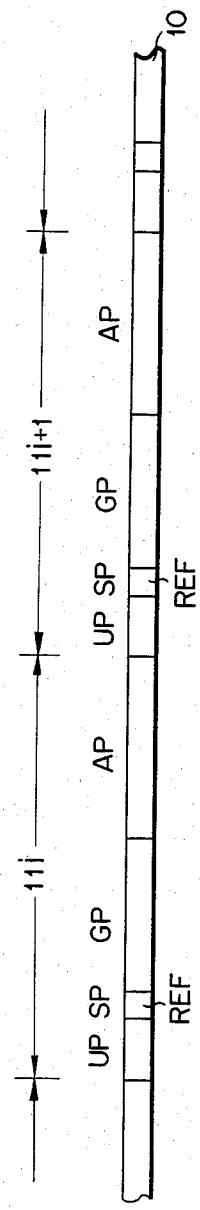
FIGS. 33 to 35 show pattern arrangements of each block on the code plate 10 shown in FIG. 32.
Figure 34:
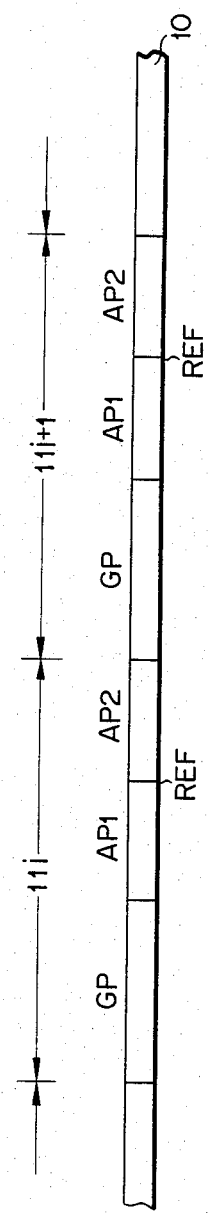
Figure 35:
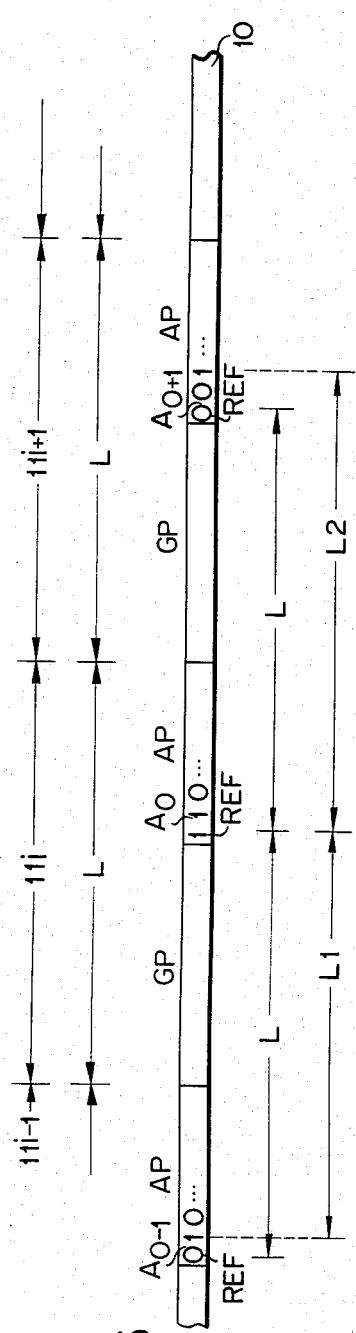

Turning now to FIGS. 33 to 35, there are shown pattern arrangements each in the block $11_i$. In FIG. 33, a single block is composed of a unique pattern UP as the block boundary pattern, a start pattern SP for indicating a reference position REF in each block, the regular grating pattern GP, and the address pattern AP. When the reference position REF is detected on the sensor, the location of regular grating pattern GP and the address pattern AP are identified on the sensor with respect to REF.

In FIG. 34, one block is comprised of the grating pattern GP, a first address pattern AP1, and a second address pattern AP2. When the upper digits and the lower digits of the pattern AP1 are interchanged with each other, the patterns AP1 and AP2 are symmetrical with respect to the boundary (REF) between them. Such patterns are unique and those patterns AP1 and AP2 are distinguished from the grating patterns disposed on both sides thereof. Accordingly, the symmetrical center of the patterns AP1 and AP2 or the center position of the combination of the patterns AP1 and AP2 may be used as the reference position REF within the block. When the reference position REF is obtained, the boundary positions between the block $11_i$ and its adjacent blocks $11_{i-1}$ and $11_{i+1}$ can be obtained since the position REF in the block is known.

In FIG. 35, one block is comprised of the grating pattern GP and the address pattern AP. In this pattern arrangement, by checking the distance from binary data "1" of the lowest digit of the address pattern AP of a block to that of an adjacent block, the reference position REF is detected. A binary coded address for the address pattern AP is designated with respect to the arranging order of the blocks. In FIG. 35, if the address number of block $11_i$ is odd, the address number of block $11_{i-1}$ or $11_{i+1}$ is even. For example, if the address of the block $11_i$ is "3 (decimal)" or "011 (binary)", the address of the block $11_{i-1}$ is "2" or "010" and the block $11_{i+1}$ is "4" or "100". Accordingly, as shown in FIG. 35, the interval L1 between the data "1" of the lowest digit of Ao-1 and that of Ao is shorter than the block length L of each block. That is, $L1 \neq L$. When such patterns Ao and Ao-1 are detected, the pattern Ao is used as the reference position REF of the block $11_i$. In this case, the reference position REF of the block $11_{i-1}$ is located at a position distanced by the block length L from the position of the pattern Ao to its left. On the other hand, the interval L2 between the data "1" of the lowest digit Ao and that of Ao+1 is longer than the block length L and therefore $L2 \neq L$. When such patterns Ao and Ao+1 are detected, the pattern Ao is used as the reference position REF of the block $11_i$. Further, the position distanced by the block length L from the pattern Ao to the right is used as the reference position REF of the block $11_{i+1}$.

When the pattern arrangement shown in FIG. 35 is used, the length of the linear sensor 14 shown in FIG. 32 is selected to cover approximately three blocks of the code plate 10. When the pattern arrangements shown in FIGS. 33 and 34 are used, the length of the linear sensor has only to be two blocks of the code plate 10. If it does so, the linear sensor 14 can always cover at least one block fully even if the relative position of the code plate 10 to the linear sensor 14 changes in any way.

Turning now to FIG. 36A shows the detail of one block $11_i$ shown in FIG. 33. In the figure, white sections indicate transparent slits while black sections indicate non-transparent slits. FIG. 36B shows a linear sensor 14 disposed relative to one block $11_i$ shown in FIG. 36A. FIG. 36C shows a level distribution of optoelectric converted outputs or reading data obtained from the respective elements $16_j$ shown in FIG. 36B. FIG. 36D shows a train of clock pulses e1 in synchronism with the outputs of the elements $16_j$. The pitches of the elements $16_j$ constituting the linear sensor 14 are designated by P. The elements $16_j$ are photodiodes of N bits individually responsive to the incident light. As shown in FIGS. 36C and 36D, the reading data RI produced from the elements $16_j$ are produced in time sequentially in synchronism with the clock pulses e1.

The block $11_i$ includes a block boundary pattern or a unique pattern UP representing the boundary position between adjacent blocks. Following the unique pattern UP, a start pattern SP serving as the reference position REF is disposed. The element illuminated through the pattern SP is used as a start bit SB. Following the start pattern SP, regular grating patterns GP are disposed with fixed intervals. One of the elements $16_j$ of N is used as an index bit IB. The position of the index bit IB may be determined by counting the number of pulses e1 occuring between the start bit SB and the index bit IB.

The index bit IB may be any one of the elements $16_1$ to $16_N$. By counting pulses e1 occurring every pitch during the period from the bit SB to the bit IB, the position of the bit may be known with the reference of the bit IB and the unit of the pitch P. Accordingly, the block $11_i$ may be measured by dividing the interval P into N.

The block $11_i$ further includes a block address pattern AP for representing the absolute position of the block. Number of clock pulses e1 corresponds to the interval from the start bit SB to the address bit AB illuminated by the address pattern AP, is previously known from the pattern arrangement of the code plate 10 and the pitch P of the linear sensor 14. Accordingly, the position of the address pattern AP is known. Therefore, the outputs of the elements $16_j$ illuminated through the pattern AP are quantized at a proper threshold level and the quantized serial data is converted into parallel data through a serial to parallel conversion. If it is done, the absolute address of the block may be detected in the form of the binary code.

The following consideration is taken to avoid an erroneous reading of the address pattern AP when the relative position of the code plate 10 to the linear sensor 14 shifted by ½ of one bit of the elements $16_j$, i.e. ½ pitch, from the state shown in FIGS. 36A and 36B. A code pattern APo forming one bit of the address pattern AP is formed by a transparent section x corresponding to two bits of the elements $16_j$ and non-transparent section y corresponding to one bit of the elements $16_j$. In FIG. 36A, the unique pattern UP is formed by the transparent section corresponding to 4 bit of the elements $16_j$. The unique pattern UP is clearly distinguished from other patterns on the code plate 10. The unique pattern UP has a low spacial frequency, that is to say, the repetitive period of alternate repetitions of the transparent sections and non-transparent sections following the former is long and the duty of the transparent section is high. Therefore, the output signals of the elements $16_j$ illuminated through the transparent section of the unique pattern UP are each wider in width and higher in signal level than the output signals of the elements $16_j$ illuminated through other patterns. This facilitates the detection of the unique pattern by distinguishing it from other patterns at the time of the signal processing. By detecting the unique pattern UP for each block, the respective blocks may be distinguished from one another. The use of one of the unique pattern UP or the start pattern SP is also allowed. For example, when the start pattern SP is not used, a specific bit element illuminated through the pattern UP may be used as the start bit SB.

FIGS. 37A to 37D correspond to FIGS. 36A to 36D and are more detailed illustrations of one block $11_i$ shown in FIG. 34. The first address pattern AP1 is composed of three digits each with five bits. The second address pattern AP2 is a three-digit pattern symmetrical to the pattern AP1 with respect to the reference position REF. In the state as shown in FIGS. 37A and 37B, there are two elements corresponding to the position REF, i.e. RB1 and RB2. In such a case, one, e.g. RB1, of the bits is previously selected as the reference bit RB. The reference bit RB may be used as the reference to detect the position of the index bit IB. In FIG. 37B, the start bit SB is located at a position shifted by the given number of bits from the bit RB. That is, when the reference position REF is determined, the start bit position SB also is determined. If so designed, the detecting operation of the bit IB in FIG. 37B is the same as that of the bit IB as mentioned referring to FIG. 36B.

As seen from the foregoing, the relative position of the code plate 10 with the entire length $L_T$ to the linear sensor 14 may be measured with the unit of the pitch P in the absolute method. Moreover, when the absolute interpolation is used, the encoder obtained has the resolution of P/N.

CIRCUIT ARRANGEMENT OF ENCODER BY ABSOLUTE METHOD FOR COARSE AND VERNIER READINGS

FIG. 38 shows an embodiment of an encoder for performing both the coarse and vernier readings in the absolute method according to the invention. The code plate 10 with a plurality of blocks, as shown in FIG. 32, is coupled with a moving table of a machine tool, for example. The linear sensor 14 is illuminated through the pattern of the code plate 10. When its pattern arrangement of the code plate 10 is as shown in FIG. 36A, the length of the linear sensor 14 is a length covering two blocks of the code plate 10, for example. Accordingly, the one scanning output of the linear sensor 14 contains data corresponding to the unique pattern UP, the start pattern SP, the regular gating pattern GP and the address pattern AP included in at least one block $11_i$ of the code plate 10. The scanning output signal serial data or reading data RI are arranged time-sequentially in synchronism with the clock pulse e1.

Here, the element positioned at the center of the linear sensor 14 is previously set as the index bit IB. The information data RI produced from the linear sensor 14 in synchronism with the clock pulse e1 generated from a sensor driver 200 is amplified by an amplifier 202 to be a signal e3 with a proper level. The signal e3 is applied to a start bit detector 250. When a train of signals corresponding to the unique pattern UP are detected from the signal e3, the detector 250 detects a signal following the signal train as that corresponding to the start pattern SP. In other words, it produces a start bit SB. Upon the detection of the start bit SB, the detector 250 produces a signal e50 with logic level "1". The signal e50 is applied to the set input terminal of a R-S flip-flop (FF) 252 and an AND gate 254, so that the FF 252 is set and the AND gate 254 is open. A signal e52 produced from the output terminal of the FF 252 is applied to an AND gate 256. Upon setting of the FF 252, the signal e52 becomes logical "1" and the AND gate 256 is open. When receiving a signal e54 with logical "1" from an index bit detector 258, the FF 252 is reset again. The detector 258 is comprised of a counter for counting the number corresponding to the position of the index bit IB.

The clock pulse e1 is applied to the AND gates 254 and 256. During the time that the FF 252 is set, the AND gate 256 is open. Accordingly, the pulse e1 applied to the AND gate 256 is applied to a binary counter 259, through the AND gate 256. During the time period that the AND gate 256 is open or that the FF 252 is set, the pulse e1 is applied to the counter 259. The FF 252 is set when the start bit SB is detected, and it is reset when the index bit IB is detected. Accordingly, the result of the count in the counter 259 is equal to the number of bits between the start bit SB and the index bit IB. In other words, the count result is coarse data D1 with the unit P (pitch of the elements $16_j$) within the block $11_i$. The data D1 is applied to a microprocessor (μ-CPU) of a general type.

The AND gate 254 enabled by the signal e50 applied from the detector 250 transfers the clock pulse e1 to first and second signal selectors 260 and 261. The first signal selector 260, after the start bit SB is detected, produces a signal e56 of logical "1" during the period from the Kth pulse to the (K+k)th pulse. In the case of FIGS. 36A and 36B, K=3 and k=11. In other words, only during the period that the linear sensor 14 produces the interpolation data or vernier data corresponding to the grating pattern GP, the signal e56 is at logical level "1". The signal e56 is applied to a first analog switch 264.

To the switch 264 is applied the signal e3 from the amplifier 202. When the signal e56 is logical "1", the switch 264 is enabled to permit the signal e3 to pass therethrough. The signal e3 after passing through the switch 264 goes into an A/D converter 266. The switch 264 is enabled only when the signal e56 is at level "1", i.e. the signal e3 includes vernier data corresponding to the pattern GP. Therefore, the signal e3 inputted to the converter 266 is an analog signal representing serial vernier data as indicated in the central part of FIG. 36C. The signal e3 is converted into parallel digital data D2 by the converter 266. The data D2 is temporarily loaded into the data register 268. The data D2 loaded into the register 268 is then applied to the μCPU 262.

The second signal selector 261, after the start bit SB is detected, produces a signal e58 of logical "1" during the period from the Mth pulse to the (M+m)th pulse. The signal e58 is applied to a second analog switch 270. To the switch 270 is applied the signal e3. The switch 270 permits the passage of only the signal component corresponding to the block address pattern AP included in the signal e3 produced from the amplifier 202. For example, if the bits of the linear sensor 14 corresponding to the pattern AP corresponding to those from the 16th and 32nd counted from the start bit SB, M=16 and m=16. During the period from the 16th to 32nd bits, the switch 270 is open.

The signal e3 is applied to the comparator 272 after passing through the switch 270. The comparator 272 quantitizes the signal e3 at a proper threshold level and converts the signal e3 into a signal e300 formed of a train of pulses with a fixed level. The signal e300 is applied to a serial to parallel converter 274 where it is converted into binary address data D3 representing an absolute address of the block detected by the linear sensor 14. The data D3 is inputted into the μCPU 262. In this way, to the μCPU is applied to coarse reading data D1, the vernier data D2 and the address data D3 of the block $11_i$ detected by the linear sensor 14.

The CPU 262 determines an absolute position of the block $11_i$ on the basis of the data D3 and the specific position within the block $11_i$ with the unit of the pitch P of the elements $16_j$ on the basis of the data D1. The CPU 262 further interpolates the length of the pitch P by using the data D2. The interpolation is performed in the manner as described referring to FIGS. 15A to 15D, for example. Specifically, the phase inverting point X representing the interpolation point is detected depending on a coincident point where data representative of the odd number envelope line OL is coincident with data representative of the even number envelope EL. Through this operation, a measurement with a resolution P/N is performed and data D4 representing the measuring result is applied to the display unit 224.

The data D4 is given by the following expression $$D4 = D3 + D1 + (P/N)D2 \qquad (8)$$

For example, the length of each block $11_i$ is 1 mm, each block $11_i$ is resoluted by the 100 output pulses of the linear sensor 14, that is to say, the pitch P of the element $16_j$ is 10 μm, and 11 bits of the elements $16_j$ correspond to 10 slits of the regular grating pattern 12, i.e. N=10. In this case, the coarse reading by the absolute method is performed up to 10 μm for each block (1 mm), and the vernier reading (interpolation) by the absolute method is performed up to 1 μm. In this way, from the equation (8), one can obtain the measurement result with the resolution 1 μm.

FIG. 39 shows an example of the start bit detector 250 shown in FIG. 38. The signal e3 produced from the amplifier 202 is applied to a level comparator $250_1$. Used for a comparing level of the comparator $250_1$ is 95% of the peak level of the signal e3 when one of the elements $16_j$ of the linear sensor 14 is entirely illuminated, or is the maximum level of the signal e3.

Only when the level of the signal e3 exceeds 95% of the maximum level, the comparator $250_1$ applies a signal e100 of logical "1" to the first input terminal of an AND gate $250_2$. Since the second terminal of the AND gate $250_2$ has received the clock pulse e1, when the third terminal is logical "1", the AND gate $250_2$ is close and open in synchronism with the pulse e1. Then, the signal e100, in synchronism with the pulse e1, is applied to a shift register $250_3$ of 3 bits, for example.

The outputs of 3 bits of the register $250_3$ are inputted to an AND gate $250_4$. In the case of FIGS. 36A and 36B, the start bit SB is present at the 6th bit counted from the bit $250_3$ corresponding to the start portion of the unique pattern UP. When three pulses of the signal e100, with start from the UB1, are applied to the register $250_3$, the contents of the register $250_3$ is "111". The AND gate $250_4$ produces a signal e110 of logical "1". The signal e110 is applied to the third terminal of the AND gate $250_2$, through an inverter $250_5$. When the contents of the register $250_3$ is "111", the AND gate $250_2$ is closed and the contents "111" of the register $250_3$ is held. So long as the contents of the register $250_3$ is "111", the signal e110 is held at logical "1".

The signal e110 is applied to the first terminal of an AND gate $250_6$. To the second input terminal of the AND gate $250_6$ is applied the clock pulse e1. So long as the signal e110 is logical "1", the AND gate $250_6$ is open, and permits the pulse e1 to pass through it to a counter $250_7$. When counting three pulses of the signal e1, the counter $250_7$ produces the signal e50 of logical "1". In other words, after the register $250_3$ counts three pulses and then the counter $250_7$ counts three pulses, the signal e50 is produced. By the signal e50 of logical "1", one knows the start bit SB after 6 bits from the bit UB1.

In FIG. 39, after the first three pulses corresponding to the pattern UP, three pulses following the first ones determine the start bit SB. Alternately, a 4-bit register is used for the register $250_3$; a 4-input terminal AND gate for the AND gate $250_4$; a counter for producing a signal e50 of logical "1" every two counts, for the counter $250_7$. After the start bit SB is detected, when the data D1, D2 and D3 are all inputted to the μCPU 262 shown in FIG. 38, the register $250_3$ and the counter $250_7$ are cleared and ready for the following start-bit SB detection.

In FIG. 40, there is shown an example of the first signal selector 260 shown in FIG. 38. The pulse e1 passing though the AND gate 254 is applied to a counter $260_1$. When the counter $260_1$ counts K pulses of e1, it produces a signal e120 of logical "1". The signal e120 sets a R-S flip-flop (FF) $260_2$. Then, the FF $260_2$ produces the signal e56 of logical "1". The signal e56 is applied to a counter $260_3$. Also to the counter $260_3$ is applied the pulse e1. During the period that the signal e56 of logical "1" is applied thereto, the counter $260_3$ counts the pulse e1. When the counter $260_3$ counts k pulses of e1, the counter $260_3$ produces a signal e130 of logical "1". The signal e130 of logical "1" resets the FF $260_2$. Upon the reset of the FF $260_2$, the logic level of the signal e56 returns to logic level "0". Thus, the signal e56 maintains logical "1" during the period from the Kth to the (K+k)th pulses of e1. After all the data D1, D2, and D3 are inputted to the μCPU 262, the counters $260_1$ and $260_3$ are cleared.

The first signal selector 260 is constructed as mentioned above. The second signal selector 262 may also be constructed in the same manner. In the selector 261, a counter producing a signal e120 of logical "1" when it counts M pulses is used for the counter $260_1$. A counter for producing a signal e130 of logical "1" when it counts m pulses is used for the counter $260_3$.

As described above, in the embodiment shown in FIG. 38, single track on the encoding plate 10 includes serially arranged patterns; the unique pattern UP to determine the position on the linear sensor 14 where the leading edge of one block $11_i$ is to be located, the start pattern SP for indicating the start position of the block, the regular grating pattern 12 or GP for interpolating one slit of the encoding plate or one pitch of the linear sensor 14, the address pattern AP (binary code) for indicating an absolute position (absolute address) of the block. Further, the linear sensor 14 is disposed in opposition to the encoding plate 10. The linear sensor 14 includes photosensor elements $16_j$ of which the number is different the number (N+1, for example) of the regular gratings within the same length as the entire length of the grating pattern in one block on the code plate 10. The light rays transmitted through the encoding plate 10 when the encoding plate 10 is illuminated are sensed by the linear sensor 14 and the output signal RI from the linear sensor 14 is properly processed thereby to detect the absolute position of the encoding plate 10 with a high precision. In the invention, the absolute position is measured by the combination of the coarse measurement (with graduations in one pitch of the linear sensor 14) and the fine or vernier measurement. Theoretically, the length of one block is sufficient for the length of the linear sensor 14. Practically, 1.5 to 2 times as long as the one block length is necessary, depending on a ratio of the grating pattern within the block.

Therefore, according to the invention, the relative position of the encoding plate 10 to the linear sensor 14 may be measured in a static state. The linear sensor 14 is used commonly for the coarse and the fine (interpolation) readings of the absolute address. Therefore, a high accuracy measurement is possible without the number of tracks on the encoding plate 10 and increasing the size of it.

Although a specific construction has been illustrated and described herein, it is not intended that the invention be limited to the elements and the constitution disclosed. One skilled in the art will recognize the paticular elements or sub-constructions may be used without departing from the spirit of the invention.

What we claim is:

1. An encoder for use in one of length and angle measuring device with high accuracy, comprising:

a code plate including at least one grating pattern being formed of a plurality of regularly arranged marks each of which has a given pitch;

a sensor array including a plurality of sensor elements whose sensing areas face the marks of said code plate and each of whose sensing areas has a second given pitch, each of said sensor elements generating an output signal which indicates the degree of overlapping between the sensing area of said sensor element and one of said marks of said grating pattern facing thereto, wherein output signals of said sensor elements constitute reading data; and a measuring processor coupled to said sensor array for providing coarse measurement data according to said reading data which indicates one pitch of any one of said marks and said sensor elements, and for performing a fine measurement according to the contents of said reading data, wherein the given pitch of said marks corresponds to a first given pitch being slightly different from the second given pitch of said sensor elements so that the ratio of said first given pitch to said second given pitch deviates from an integer number, thereby obtaining a level envelope of said reading data exhibiting a periodical oscillation whose period corresponds to twice said second pitch, wherein said measuring processor includes a first circuit means for detecting from the level envelope of said reading data a characteristic part of the periodical oscillation of said reading data, and generating fine measurement data which corresponds to interpolation data of said one pitch; and second circuit means coupled to said first circuit means for performing a dimensional measurement of the encoder according to said coarse measurement data and said fine measurement data, wherein the reading data obtained from odd number elements of said sensor array exhibits an odd group envelope and the reading data obtained from even number elements of said sensor array exhibits an even group envelope, and said first circuit means includes an intersecting detector for detecting an intersecting point of said odd group envelope and said even group envelope, said intersecting point being used as said characteristic part.

2. The encoder of claim 1 wherein the periodical oscillation of said reading data is phase-inverted at a specific point, and said first circuit means includes a phase inversion discriminator for discriminating said specific point of phase inversion from the periodical oscillation of said reading data, said specific point of phase inversion being used as said characteristic part.

3. The encoder of claim 1 wherein said first circuit means includes a divider circuit for dividing said reading data into odd data corresponding to said odd group envelope and into even data corresponding to said even group envelope, and said intersecting detector detects said intersecting point when the level of said odd data coincides with the level of said even data.

4. The encoder of claim 1 wherein the range for the interpolation is larger than said one pitch.

5. The encoder of claim 1 wherein said marks are formed of a first group and a second group, the light transmittance of said first group is different from that of said second group, and the marks of said first group and the marks of said second group are arranged alternately, and wherein said sensor elements are formed of photosensors which are illuminated by light through the first and second groups of said marks and which provide said reading data having various levels.

6. The encoder of claim 1 wherein said marks are formed of a first magnetic pattern and a second magnetic pattern, the magnetized state of said first magnetic pattern is different from that of said second magnetic pattern, and the marks of said first magnetic pattern and that of said second magnetic pattern are arranged alternately, and wherein said sensor elements are formed of magnetic sensors which are subjected to magnetic fluxes generated from said first and second magnetic patterns and which provide said reading data having various levels.

7. The encoder of claim 4 wherein said range for the interpolation is substantially equal to twice said one pitch.

8. An encoder for use in one of length and angle measuring device with high accuray, comprising:

a code plate including at least one grating pattern being formed of a plurality of regularly arranged marks each of which has a given pitch;

a sensor array including a plurality of sensor elements whose sensing areas face the marks of said code plate and each of whose sensing areas has a second given pitch, each of said sensor elements generating an output signal which indicates the degree of overlapping between the sensing area of said sensor element and the mark of said grating pattern facing thereto, wherein output signals of said sensor elements constitute reading data; and a measuring processor coupled to said sensor array for providing coarse data which indicates one pitch of said sensor elements, and for performing a fine measurement according to the contents of said reading data, wherein the given pitch of said marks corresponds to a first given pitch being slightly different from the second given pitch of said sensor elements so that the ratio of said first given pitch to said second given pitch deviates from an integer number, thereby obtaining a level envelope of said reading data exhibiting a periodical oscillation whose period corresponds to twice said second pitch, wherein said code plate is formed of a plurality of blocks serially arranged, each block of which includes said grating pattern, and a reference pattern for indicating a reference position of the block, the pattern arrangement of said reference pattern being different from the pattern arrangement of said grating pattern, and wherein said processor means includes a detector means coupled to said sensor array for detecting from said reading data a first location of said reference pattern in the block in order to generate a first signal indicating one pitch of said sensor elements and to generate a second signal indicating a second location of said grating pattern in the block; coarse means coupled to said detector means for generating said coarse data according to said first signal; fine means coupled to said detector means for generating fine data according to said second signal and said reading data, said fine data containing information to said level envelope; and measurement means coupled to said coarse means and fine means for measuring said one pitch from said coarse data, and discriminating from the level envelope information of said fine data a characteristic part of the periodical oscillation of said reading data in order to interpolate said one pitch according to said characteristic part; and wherein the reading data obtained from odd number elements of said sensor array exhibits an odd group envelope and the reading data obtained from even number elements of said sensor array exhibits an even group envelope, and said measurement means detects an intersecting point of said odd group envelope and said even group envelope, said intersecting point being used as said characteristic part.

9. The encoder of claim 1 or 8 wherein said reading data has various levels according to the degrees of overlapping between said sensor elements and said marks, and said measurement means detects a specific point at which said reading data has a given level, said specific point being used as said characteristic part; and wherein said given level is defined by an approximate medium level between the maximum level and the minimum level of said reading data.

10. The encoder of claim 8, wherein each of said block further includes a block address pattern for indicating an absolute position of the block, the pattern arrangement of said block address pattern being different from that of said reference pattern and from that of said grating pattern, said detector means generates a third signal indicating a third location of said block address pattern in the block, said processor means further includes address means coupled to said detector means for generating address data according to said third signal and said reading data, and said measurement means determines said absolute position of the block according to said address data and generates measurement data corresponding to said coarse data, fine data and address data.

11. The encoder of claim 8 wherein the periodical oscillation of said reading data is phase-inverted at a specific point, and said measurement means discriminates said specific point of phase inversion from the periodical oscillation of said reading data, said specific point of phase inversion being used as said characteristic part.

12. The encoder of claim 8 wherein said measurement means divides said reading data into odd data corresponding to said odd group envelope and into even data corresponding to said even group envelope, and detects said intersecting point when the level of said odd data coincides with the level of said even data.

13. The encoder of claim 8 wherein the range for the interpolation is larger than said one pitch.

14. The encoder of claim 8 wherein said marks are formed of a first group and a second group, the light transmittance of said first group is different from that of said second group, and the marks of said first group and the marks of said second group are arranged alternately, and wherein said sensor elements are formed of photosensors which are illuminated by light through the first and second groups of said marks and which provide said reading data having various levels.

15. The encoder of claim 8 wherein said marks are formed of a first magnetic pattern and a second magnetic pattern, the magnetized state of said first magnetic pattern is different from that of said second magnetic pattern, and the marks of said first magnetic pattern and that of said second magnetic pattern are arranged alternately, and wherein said sensor elements are formed of magnetic sensors which are subjected to magnetic fluxes generated from said first and second magnetic patterns and which provide said reading data having various levels.

16. The encoder of claim 13 wherein said range for the interpolation is substantially equal to double of said one pitch.

17. The encoder of claim 8 or 10 wherein the size of said sensor array substantially covers at least one of said blocks.

18. An encoder for use in one of length and angle measuring devices with high accuracy, comprising:

a code plate including at least one block which has a grating pattern formed of a plurality of regularly arranged marks each of which has a given pitch;

a sensor array including a plurality of sensor elements whose sensing areas face the marks of said grating pattern and each of whose sensing areas has a second given pitch, wherein output signals of said sensor elements constitute reading data; and a measuring processor coupled to said sensor array for providing coarse data which indicates one pitch of said sensor elements, and for performing a fine measurement according to the contents of said reading data, wherein the given pitch of said marks corresponds to a first given pitch being slightly different from the second given pitch of said sensor elements so that the ratio of said first given pitch to said second given pitch deviates from an integer number, thereby obtaining a level envelope of the output signals from said sensor elements exhibiting a periodical oscillation whose period corresponds to said one pitch, wherein said block includes a reference pattern for indicating a reference position of the block, the pattern arrangement of said reference pattern being different from the pattern arrangement of said grating pattern, and wherein said processor means includes a coarse means coupled to said sensor array for detecting from said reading data a specific location of said reference pattern in the block in order to generate said coarse data; fine means coupled to said sensor array for generating fine data according to a characteristic part of said level envelope, said characteristic part representing an interpolation point of said one pitch, thereby said fine data having interpolation information regarding said one pitch; and measurement means coupled to said coarse means and fine means for performing a dimensional measurement of the encoder according to said coarse data and said fine data;

wherein the reading data obtained from odd number elements of said sensor array exhibits an odd group envelope and the reading data obtained from even number elements of said sensor array exhibits an even group envelope, and said measurement means includes an intersecting detector for detecting an intersecting point of said odd group envelope and said even group envelope, said intersecting point being used as said characteristic part.

19. An encoder for use in one of length and angle measuring devices with high accuracy, comprising:

a code plate including at least one block which has a grating pattern formed of a plurality of regularly arranged marks each of which has a given pitch;

a sensor array including a plurality of sensor elements whose sensing areas face toward the marks of said grating pattern and each of whose sensing areas has a second given pitch, wherein output signals of said sensor elements constitute reading data; and a measuring processor coupled to said sensor array for providing coarse data which indicates one pitch of said sensor elements, and for performing a fine measurement according to the contents of said reading data, wherein the given pitch of said marks corresponds to a first given pitch being slightly different from the second given pitch of said sensor elements so that the ratio of said first given pitch to said second given pitch deviates from an integer number, thereby a level envelope of the output signals from said sensor elements exhibiting a periodical oscillation whose period corresponds to said one pitch, wherein said code plate is formed of a plurality of blocks serially arranged, each block of which includes a block address pattern for indicating an absolute position of the block, the pattern arrangement of said block address pattern being different from the pattern arrangement of said grating pattern, and wherein said processor means includes a coarse means coupled to said sensor array for detecting from said reading data a specific location of said block address pattern in the block in order to generate said coarse data; address means coupled to said sensor array for discriminating the block address pattern to generate address data; fine means coupled to said sensor array for generating fine data according to a characteristic part representing an interpolation point of said one pitch, thereby said fine data having interpolation information regarding said one pitch; and measurement means coupled to said coarse means, fine means and address means for performing a dimensional measurement of the encoder according to said coarse data, said fine data and said address data, wherein the reading data obtained from odd number elements of said sensor array exhibits an odd group envelope and the reading data obtained from even number elements of said sensor array exhibits an even group envelope, and said measurement means includes an intersecting detector for detecting an intersecting point of said odd group envelope and said even group envelope, said intersecting point being used as said characteristic part.

* * * * *